US012805284B2

(12) United States Patent
Zou et al.

(10) Patent No.: US 12,805,284 B2
(45) Date of Patent: Nov. 17, 2026

(54) SOURCE/DRAIN PROTECTION USING A BACKSIDE PLACEHOLDER

(71) Applicant: International Business Machines Corporation, Armonk, NY (US)

(72) Inventors: Lijuan Zou, Slingerlands, NY (US); Shahrukh Khan, Sandy Hook, CT (US); Biswanath Senapati, Mechanicville, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 581 days.

(21) Appl. No.: 18/337,211

(22) Filed: Jun. 19, 2023

(65) Prior Publication Data

US 2024/0421037 A1 Dec. 19, 2024

(51) Int. Cl.

| | |
|---|---|
| ***H10W 20/20*** | (2026.01) |
| ***H10D 30/01*** | (2025.01) |
| ***H10D 30/43*** | (2025.01) |
| ***H10D 30/67*** | (2025.01) |
| ***H10D 62/10*** | (2025.01) |

(Continued)

(52) U.S. Cl.

CPC .......... *H10W 20/20* (2026.01); *H10D 30/014* (2025.01); *H10D 30/43* (2025.01); *H10D 30/6729* (2025.01); *H10D 30/6735* (2025.01); *H10D 30/6757* (2025.01); *H10D 62/121* (2025.01); *H10D 64/017* (2025.01); *H10D 84/0167* (2025.01); *H10D 84/017* (2025.01); *H10D 84/0184* (2025.01); *H10D 84/0186* (2025.01); *H10D 84/038* (2025.01); *H10D 84/85* (2025.01)

(58) Field of Classification Search

CPC ................ H01L 23/481; H10D 30/014; H10D 84/0186; H10D 84/85; H10D 30/6757; H10D 62/121; H10D 64/017; H10D 84/0167; H10D 84/0184; H10D 30/6735; H10D 84/017; H10D 30/43; H10D 84/038; H10D 30/6729

USPC .......................................................... 257/734

See application file for complete search history.

(56) References Cited

U.S. PATENT DOCUMENTS

| | | | |
|---|---|---|---|
| 9,466,723 | B1 | 10/2016 | Huang |
| 10,797,139 | B2 | 10/2020 | Morrow |

(Continued)

*Primary Examiner* — Norman D Richards
*Assistant Examiner* — Colin Russell Mccutcheon
(74) *Attorney, Agent, or Firm* — Harrity & Harrity, LLP

(57) ABSTRACT

Embodiments of the invention include a method for fabricating a semiconductor device and the resulting structure. A plurality of nanosheet recesses are formed within a substrate. A placeholder structure is formed on a bottom surface within each nanosheet recess. A first source/drain region is formed within a first nanosheet recess. A second source/drain region is formed within the second nanosheet recess. The semiconductor structure is flipped. The substrate is removed respective to a sidewall spacer of the placeholder structure and a first etch stop layer of the placeholder structure. Backside interlayer dielectric is formed. A backside contact trench to the second source drain region is formed by removing a portion of the backside interlayer dielectric over the second source/drain region and removing exposed portions of the first etch stop layer, the sidewall spacer, and a silicon buffer layer of the placeholder structure. A backside contact is formed within the trench.

12 Claims, 36 Drawing Sheets

(51) Int. Cl.

| | |
|---|---|
| ***H10D 64/01*** | (2025.01) |
| ***H10D 84/01*** | (2026.01) |
| ***H10D 84/03*** | (2025.01) |
| ***H10D 84/85*** | (2025.01) |

(56) References Cited

U.S. PATENT DOCUMENTS

| | | | | |
|---|---|---|---|---|
| 11,264,481 | B2 | 3/2022 | Park | |
| 2021/0111115 | A1 | 4/2021 | Patrick | |
| 2021/0134721 | A1 | 5/2021 | Chiang | |
| 2021/0202385 | A1* | 7/2021 | Huang | H10D 84/038 |
| 2021/0305252 | A1 | 9/2021 | Chiang | |
| 2021/0305381 | A1 | 9/2021 | Chiang | |
| 2021/0351303 | A1* | 11/2021 | Ju | H01L 21/76897 |
| 2021/0376071 | A1* | 12/2021 | Liu | H10D 62/115 |
| 2021/0376093 | A1 | 12/2021 | Chu | |
| 2021/0399099 | A1* | 12/2021 | Chu | H01L 21/28525 |
| 2022/0130759 | A1* | 4/2022 | Huang | H10W 20/427 |
| 2022/0139911 | A1 | 5/2022 | Wei | |
| 2022/0352339 | A1 | 11/2022 | Wang | |
| 2023/0093101 | A1 | 3/2023 | Xie | |

* cited by examiner

SOURCE/DRAIN PROTECTION USING A BACKSIDE PLACEHOLDER

BACKGROUND

The present invention relates generally to the field of semiconductor devices and fabrication, and more particularly to a placeholder structure beneath a first source/drain region that protects the first source drain region during fabrication of a backside contact for a second source/drain region.

A field-effect transistor (FET) is a type of transistor that uses an electric field to control the flow of current in a semiconductor. A FET includes three terminals, a source, gate, and drain. FETs control the flow of current by the application of a voltage to the gate, which in turn alters conductivity between the drain and source.

A power delivery network is designed to provide power supply and reference voltage to active devices. Traditionally, this is realized as a network of low-resistive metal wires fabricated through back end of line (BEOL) processing on the frontside of a wafer. A backside power delivery network (BPDN) moves the power distribution network to the backside of the wafer and enables direct power delivery through wider, less resistive metal lines, without electrons needing to travel through a complex BEOL stack.

A buried power rail (BPR) or backside power rail (BSPR) is a metal line construct buried below transistors, partially within a substrate and partially within a shallow trench isolation (STI) layer. Such a power rail takes the role of power rails that have traditionally been implemented at the BEOL level.

SUMMARY

Embodiments of the invention include a semiconductor structure that includes a first source/drain region electrically connected to a backside power rail through a backside contact. A second source/drain region is electrically connected to a back end of line (BEOL) interconnect through a frontside contact. A placeholder structure is on a surface of the second source/drain region, where the placeholder structure is laterally adjacent to the backside contact.

Embodiments of the invention also include a semiconductor structure that includes a first source/drain region and a second source/drain region. A placeholder structure is on a surface of the second source/drain region on a backside of the second source/drain region opposite of a frontside, where the frontside is contacting a first contact. A second contact is contacting the first source/drain region, the second contact adjacent to the placeholder structure, where a backside interlayer dielectric layer separates the second contact and the placeholder structure.

Embodiments of the invention include a method for fabricating a semiconductor device. The method includes forming a plurality of nanosheet recesses within a substrate. The method can also include forming a placeholder structure on a bottom surface within each nanosheet recess. The method can also include forming a first source/drain region within a first nanosheet recess. The method can also include forming a second source/drain region within the second nanosheet recess. The method can also include flipping the semiconductor structure. The method can also include selectively removing the substrate respective to a sidewall spacer of the placeholder structure and a first etch stop layer of the placeholder structure. The method can also include forming backside interlayer dielectric. The method can also include forming a backside contact trench to the second source/drain region by (i) removing a portion of the backside interlayer dielectric over the second source/drain region and (ii) removing exposed portions of the first etch stop layer, the sidewall spacer of the placeholder structure, and a silicon buffer layer of the placeholder structure. The method can also include forming a backside contact within the backside contact trench.

DETAILED DESCRIPTION

Figure 1:
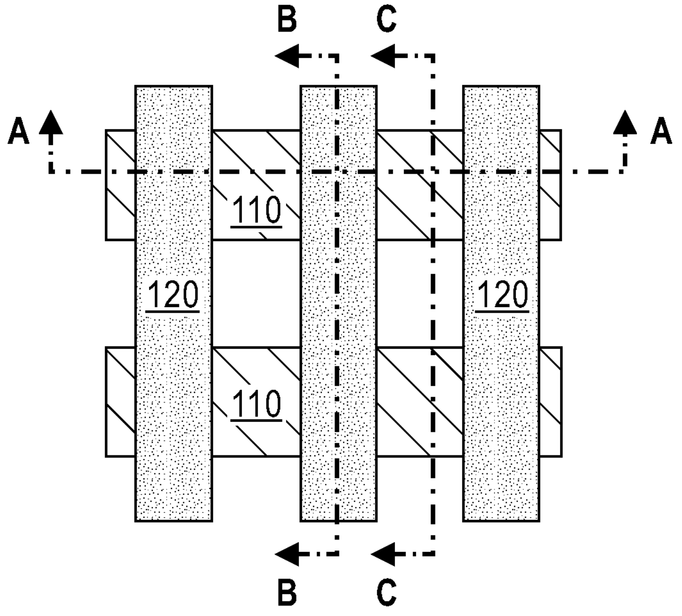
FIG. 1 depicts a top-down simplified view of a device, the device including gates and active device areas of each stacked field-effect transistor (FET) structure, in accordance with an embodiment of the present invention.

Embodiments of the present invention recognize that key challenges exist in fabrication steps relating to placeholder depth control, placeholder profile control, placeholder epitaxial growth control, and the epitaxial growth. Embodiments of the present invention further recognize that key challenges exist related to silicon removal damage to source/drain epitaxy regions if bottom dielectric isolation (BDI) is imperfect or if there is exposure to hafnium (IV) oxide ($HfO_2$). Embodiments of the present invention further recognize that a silicon germanium (SiGe) profile may change during silicon removal.

Embodiments of the present invention recognize that one approach to addressing some of the described key challenges is to include placeholders under each source/drain epitaxy region and that such an approach makes backside interlayer dielectric (ILD) chemical-mechanical planarization (CMP) stopping at the placeholder an easier process. In such an approach, a backside block copolymer (BC) mask may be used to selectively remove the placeholder for backside contact formation. Embodiments of the present invention recognize (i) an approach to address some of the described key challenges which mitigates source/drain epitaxy damage issues during backside Si removal associated with imperfect BDI by using a SiGe placeholder to isolate all source/drain regions from the substrate and (ii) that a key risk in such an approach is the requirement for SiGe upper position accuracy and that there is no margin for error in the process.

Embodiments of the present invention describe an approach for fabricating a semiconductor device, the approach including forming a nanosheet recess into a substrate. Embodiments of the present invention further describe forming a sidewall spacer to protect the sidewall of the substrate recess and the inner spacer. Embodiments of the present invention further describe forming an etch stop layer. Embodiments of the present invention further describe forming a buffer silicon layer over the etch stop layer. Embodiments of the present invention further describe forming a source/drain epitaxy region over the silicon buffer layer. Embodiments of the present invention further describe flipping the wafer. Embodiments of the present invention further describe selectively removing the substrate respective to the sidewall spacer and the etch stop layer. Embodiments of the present invention further describe forming a backside ILD. Embodiments of the present invention further describe forming a backside contact landing over exposed etch stop layer. Embodiments of the present invention further describe removing the etch stop layer, silicon buffer layer, and sidewall spacer. Embodiments of the present invention further describe forming a backside contact.

Embodiments of the present invention describe a resulting semiconductor structure that includes a first source/drain region wired to a backside power rail through a backside contact and a second source/drain region wired to a back end of line (BEOL) interconnect through a frontside contact. Embodiments of the present invention may further describe a resulting semiconductor structure that includes a placeholder structure under the second source/drain region that includes a silicon buffer layer, a SiGe etch stop layer under the silicon buffer layer, and a sidewall spacer layer which isolates the silicon buffer layer from the inner spacer. Embodiments of the present invention may further describe a resulting semiconductor structure where the sidewall spacer is also formed between the backside ILD and the SiGe etch stop layer.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Each reference number may refer to an item individually or collectively as a group. For example, source/drain region 710 may refer to a single source drain region 710 or multiple source/drain regions 710.

The present invention will now be described in detail with reference to the Figures.

FIG. 1 is a simplified depiction of the device and is provided primarily to establish a frame of reference for the presence of the cross-sectional views of the other Figures. Accordingly, many objects and features that are present in the cross-sectional views are not depicted in FIG. 1. Further, FIG. 1 is a top view. FIG. 1 generally shows the location of the gates 120 and active device area (RX) 110 of each stacked field-effect transistor (FET) structure.

Figure 2A:
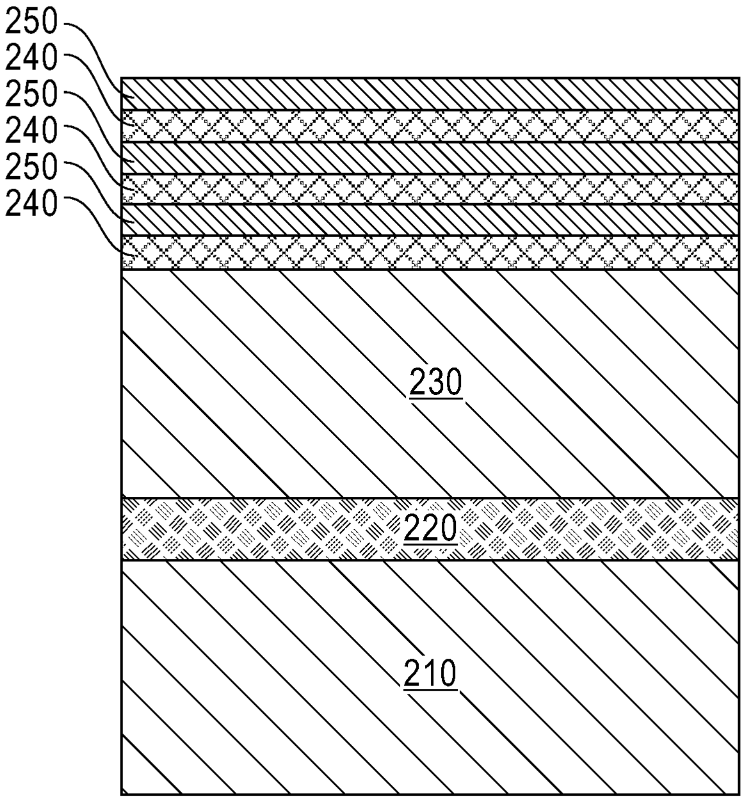
FIG. 2A depicts a cross-sectional view, along section line A of FIG. 1.
Figure 2C:
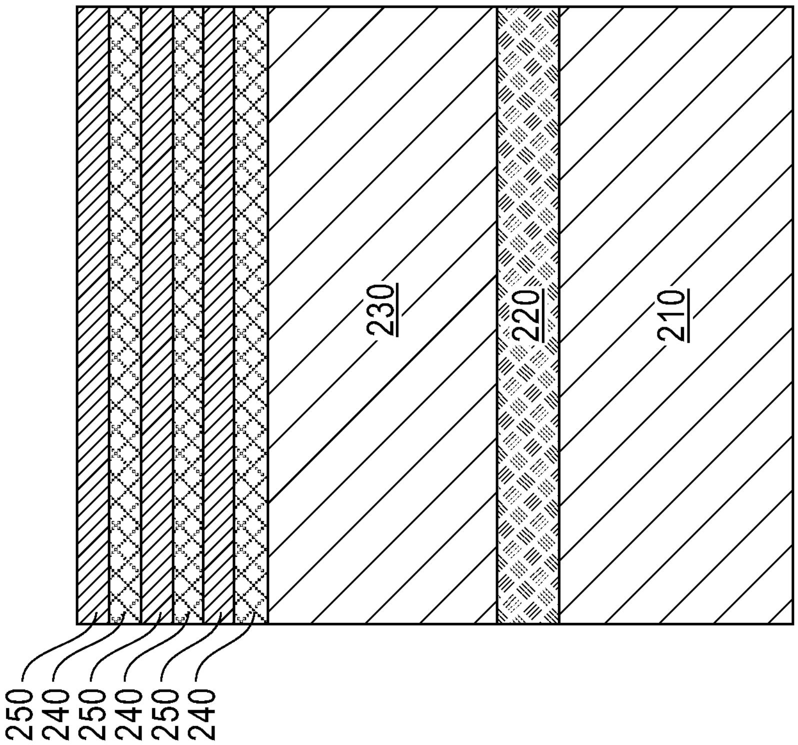
FIG. 2C depicts a cross-sectional view, along section line C of FIG. 1, of a device upon which embodiments of the invention can be fabricated, in accordance with an embodiment of the present invention.
Figure 2B:
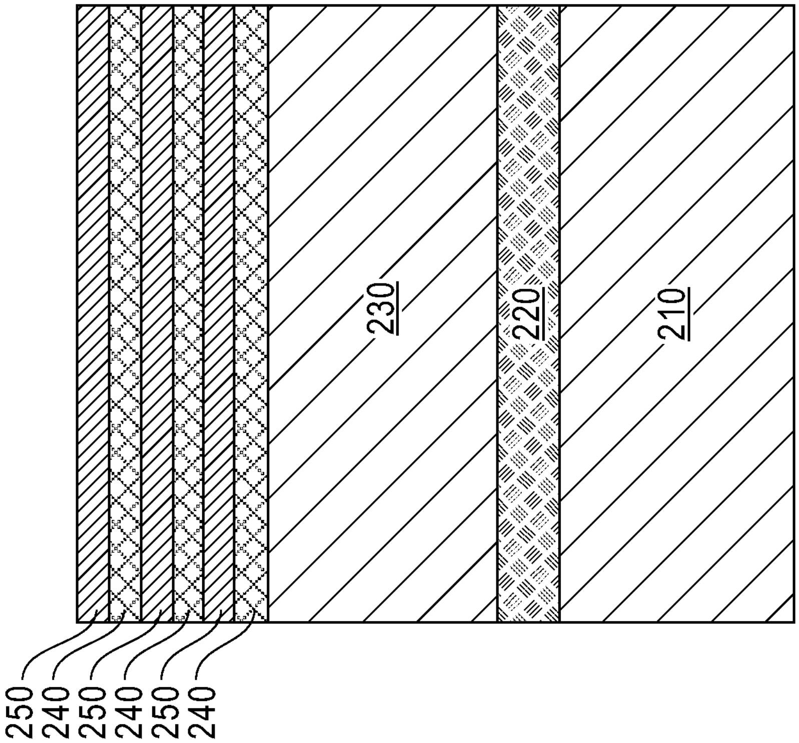
FIG. 2B depicts a cross-sectional view, along section line B of FIG. 1.

FIG. 2A depicts a cross-sectional view, of a device at an early stage in the method of forming the device, along section line A of FIG. 1, FIG. 2B depicts a cross-sectional view along section line B of FIG. 1, and FIG. 2C depicts a cross-sectional view along section line C of FIG. 1.

The semiconductor structure of FIGS. 2A-2C includes a semiconductor substrate upon which embodiments of the invention can be fabricated.

Semiconductor substrate 210 may be composed of a silicon containing material. Silicon containing materials include, but are not limited to, silicon, single crystal silicon, polycrystalline silicon, SiGe, single crystal SiGe, polycrystalline SiGe, or silicon doped with carbon (C), amorphous silicon, and combinations and multi-layers thereof. Semiconductor substrate 210 can also be composed of other semiconductor materials, such as germanium (Ge), and compound semiconductor substrates, such as type III/V semiconductor substrates, e.g., gallium arsenide (GaAs). In general, semiconductor substrate 210 is a smooth surface substrate. In some embodiments (not shown), semiconductor substrate 210 can be a partially processed complementary metal-oxide semiconductor (CMOS) integrated wafer with transistors and wiring levels or gate electrodes embedded beneath the surface.

Etch stop layer 220 is present above semiconductor substrate 210. Etch stop layer 220 acts as a layer used to define the structure thickness by stopping the etch when the etch stop layer is reached. Etch stop layer 220 may be composed of, for example, silicon dioxide or epitaxy SiGe.

Semiconductor layer 230 is present above etch stop layer 220. Semiconductor layer 230 may be composed of a silicon containing material such as the silicon containing materials discussed with respect to semiconductor substrate 210.

In the depicted embodiment, a semiconductor material stack (sacrificial semiconductor material layer 240, semiconductor channel material layer 250) is formed upon semiconductor layer 230. The semiconductor material stack includes vertically aligned alternating layers of sacrificial semiconductor material layer 240 and semiconductor channel material layer 250. The semiconductor material stack is sequentially formed upon the semiconductor layer 230. As mentioned above, the semiconductor material stack includes sacrificial semiconductor material layers 240 and semiconductor channel material layers 250, which alternate one atop the other. In FIGS. 2A-2C, and only by way of one example, the semiconductor material stack includes three layers of sacrificial semiconductor material layer 240 and three layers of semiconductor channel material layer 250. The semiconductor material stacks that can be employed in embodiments of the present invention are not limited to the specific embodiment illustrated in FIGS. 2A-2C. Instead, the semiconductor material stack can include any number of sacrificial semiconductor material layers 240 and semiconductor channel material layers 250. The semiconductor material stack is used to provide a gate-all-around device that includes vertically stacked semiconductor channel material nanosheets. It should be noted that while the depicted embodiment uses a nanosheet device, the device can be any kind of non-vertical or horizontal device, such as, for example, fin field-effect transistor (FinFET), planar FET, nanowire, or extremely-thin silicon-on-insulator (ETSOI).

Each sacrificial semiconductor material layer 240 is composed of a first semiconductor material which differs in composition from the semiconductor layer 230 or semiconductor channel material layer 250. In one embodiment, each sacrificial semiconductor material layer 240 is composed of silicon germanium with Ge % 20% to 35% and the semiconductor channel material layer 250 is composed of silicon. Sacrificial semiconductor material layer 240 and semiconductor channel material layer 250 can be formed utilizing epitaxial growth from semiconductor layer 230.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the first and second semiconductor materials that provide the sacrificial semiconductor material layers 240 and the semiconductor channel material layers 250, respectively, can be performed utilizing any well-known precursor gas or gas mixture. Carrier gases like hydrogen, nitrogen, helium and argon can be used.

The sacrificial semiconductor material layers 240 that constitute the semiconductor material stack may have a thickness from five nm to twenty nm, while the semiconductor channel material layers 250 that constitute the semiconductor material stack may have a thickness from six nm to twelve nm. Each sacrificial semiconductor material layer 240 may have a thickness that is the same as, or different from, a thickness of each semiconductor channel material layer 250. In an embodiment, each sacrificial semiconductor material layer 240 has an identical thickness. In an embodiment, each semiconductor channel material layer 250 has an identical thickness.

Figure 3A:
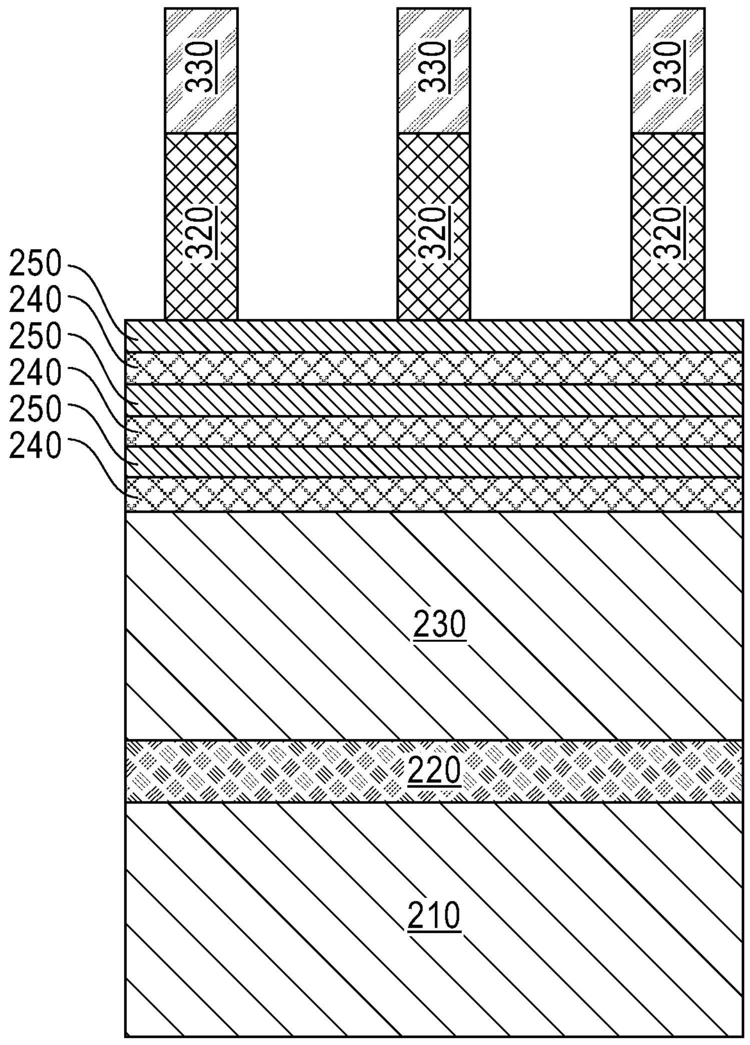
FIG. 3A depicts a cross-sectional view, along section line A of FIG. 1.
Figure 3C:
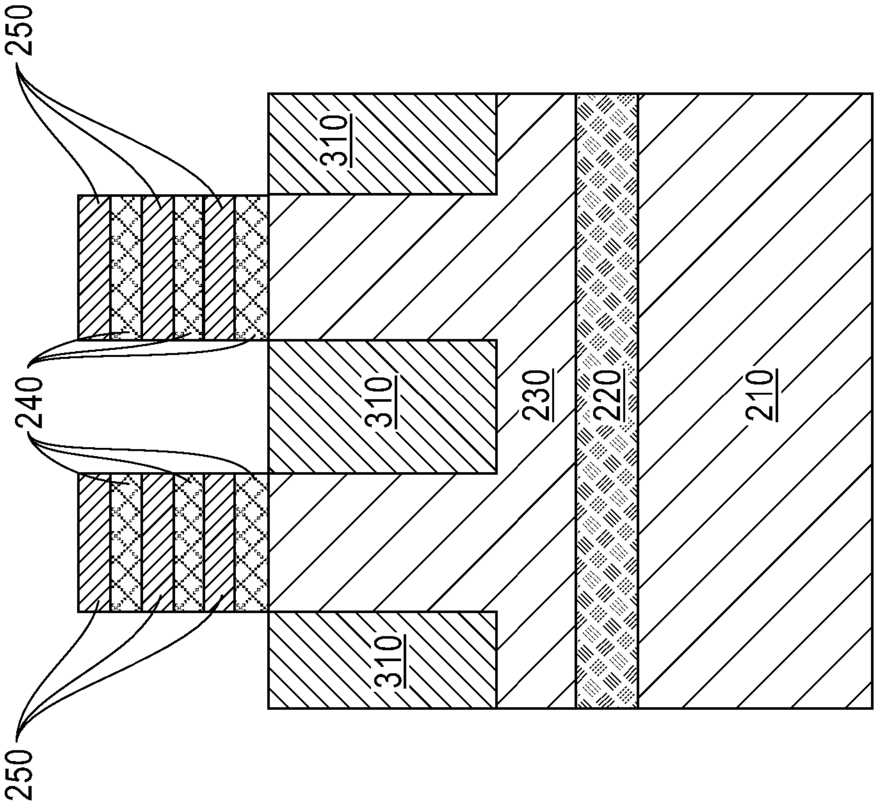
FIG. 3C depicts a cross-sectional view, along section line C of FIG. 1, of a process of patterning and forming each semiconductor material stack, as well as the formation of shallow trench isolation (STI) layer, sacrificial gate structure, and sacrificial dielectric cap, in accordance with an embodiment of the present invention.
Figure 3B:
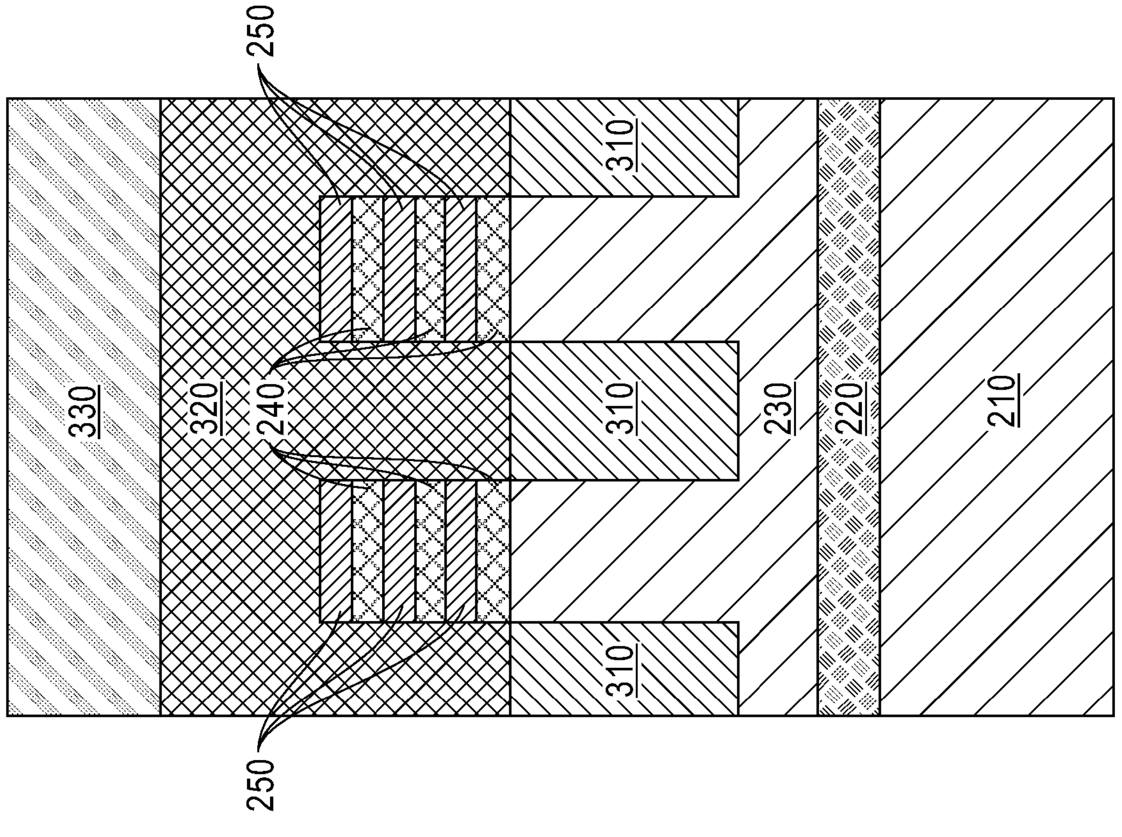
FIG. 3B depicts a cross-sectional view, along section line B of FIG. 1.

FIG. 3A depicts a cross-sectional view, of fabrication steps, along section line A of FIG. 1, FIG. 3B depicts a cross-sectional view along section line B of FIG. 1, and FIG. 3C depicts a cross-sectional view along section line C of FIG. 1. FIGS. 3A-3C depict the patterning and formation of each semiconductor material stack, as well as the formation of shallow trench isolation (STI) layer 310, sacrificial gate structure 320, and sacrificial dielectric cap 330.

Following epitaxial growth of the topmost layer of the semiconductor material stack (sacrificial semiconductor material layer 240, semiconductor channel material layer 250) a patterning process may be used to provide the semiconductor material stack. Patterning may be achieved by lithography and etching as is well known to those skilled in the art.

Shallow trench isolation (STI) layer 310 may be formed by patterning a hardmask layer (not shown) using lithography and etching such that top surfaces of portions of semiconductor layer 230 are exposed corresponding to locations where trenches for STI layer 310 are desired. Accordingly, the hardmask layer is patterned such that semiconductor layer 230 is exposed at desired trench locations for STI layer 310.

Physically exposed portions of semiconductor layer 230 are removed. The removing of portions of semiconductor layer 230 can be performed utilizing an anisotropic etching process such as, for example, reactive ion etching (RIE). Portions of semiconductor layer 230 remain beneath the hardmask.

A sacrificial gate structure 320 may be formed. Each sacrificial gate structure is located on a first side and a second side of the semiconductor material stack (sacrificial semiconductor material layer 240, semiconductor channel material layer 250) and spans across a topmost surface of a portion of the semiconductor material stack (sacrificial semiconductor material layer 240, semiconductor channel material layer 250). Each sacrificial gate structure 320 thus straddles over a portion of the semiconductor material stack (sacrificial semiconductor material layer 240, semiconductor channel material layer 250).

Each sacrificial gate structure 320 may include a single sacrificial material portion or a stack of two or more sacrificial material portions (i.e., at least one sacrificial material portion). In one embodiment, the at least one sacrificial material portion comprises, from bottom to top, a sacrificial gate layer 320 portion and a sacrificial dielectric cap 330 portion. In some embodiments, the sacrificial dielectric cap 330 portion can be omitted and only a sacrificial gate layer 320 portion is formed. The at least one sacrificial material portion can be formed by forming a blanket layer (or layers) of a material (or various materials) and then patterning the material (or various materials) by lithography and an etch. In one embodiment, the at least one sacrificial material portion can be formed by first depositing a blanket layer of a sacrificial gate material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material 320 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hardmask material such as, for example, silicon dioxide and/or silicon nitride. The sacrificial gate cap material can be formed by any suitable deposition process such as, for example, chemical vapor deposition (CVD) or plasma enhanced chemical vapor deposition (PECVD).

After providing the above mentioned sacrificial material stack (or any subset of the sacrificial materials), lithography and etching can be used to pattern the sacrificial material stack (or any subset of the sacrificial materials) and to provide the at least one sacrificial gate structure. The remaining portions of the sacrificial gate material constitute a sacrificial gate layer 320 portion, and the remaining portions of the sacrificial dielectric cap material constitute a sacrificial dielectric cap 330 portion.

Figure 4A:
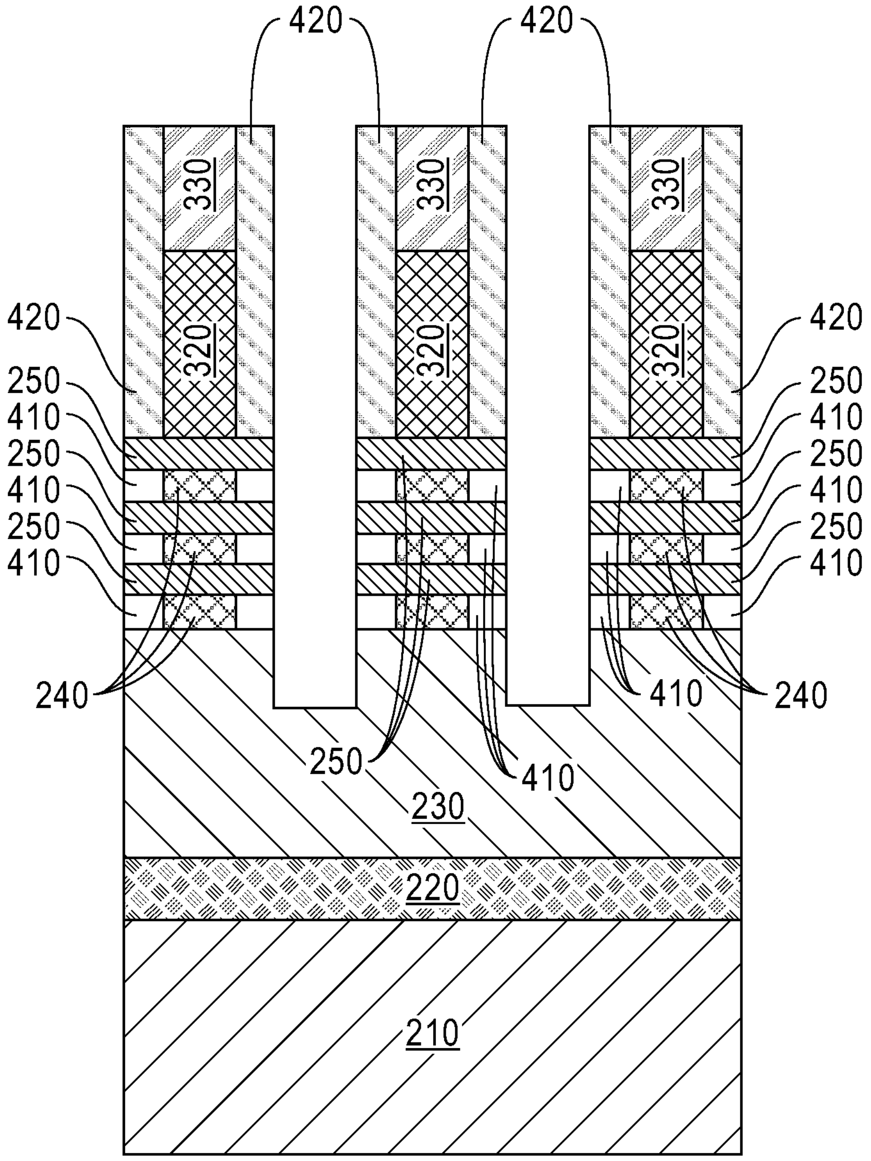
FIG. 4A depicts a cross-sectional view, along section line A of FIG. 1.
Figure 4C:
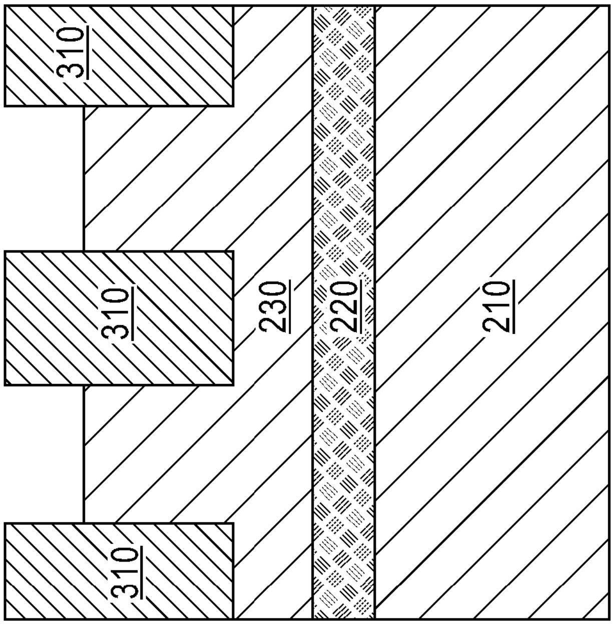
FIG. 4C depicts a cross-sectional view, along section line C of FIG. 1, of a process of forming a dielectric spacer material layer, forming recesses within the semiconductor material stack to create nanosheet stacks, recessing a sacrificial semiconductor material layer, and forming inner spacers, in accordance with an embodiment of the present invention.
Figure 4B:
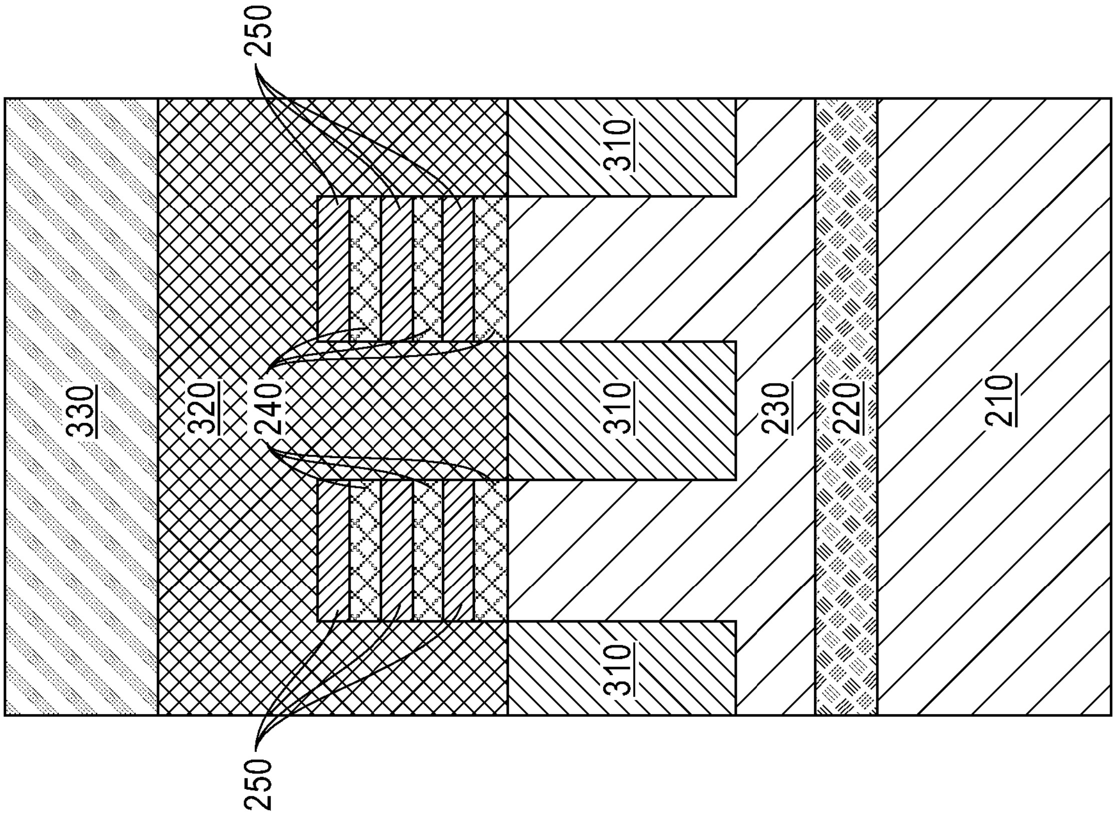
FIG. 4B depicts a cross-sectional view, along section line B of FIG. 1.

FIG. 4A depicts a cross-sectional view, of fabrication steps, along section line A of FIG. 1, FIG. 4B depicts a cross-sectional view along section line B of FIG. 1, and FIG. 4C depicts a cross-sectional view along section line C of FIG. 1. FIGS. 4A-4C depict the formation of dielectric spacer material layer 420, the formation of recesses within the semiconductor material stack to create nanosheet stacks, the recessing of sacrificial semiconductor material layer 240, and the formation of inner spacers 270.

After providing the sacrificial gate structure 320 and the sacrificial dielectric cap 330, dielectric spacer material layer 420 can be formed on exposed surfaces of each sacrificial gate structure 320 and each sacrificial dielectric cap 330. The dielectric spacer material layer 420 can be formed by first providing a dielectric spacer material and then etching the dielectric spacer material. One example of a dielectric spacer material that may be employed in the present application is silicon nitride. In general, the dielectric spacer material layer 420 comprises any dielectric spacer material, including, for example, a dielectric nitride, dielectric oxide, and/or dielectric oxynitride. More specifically, the dielectric spacer material layer 420 may be, for example, SiBCN, SiBN, SiOCN, SION, SiCO, or SiC. In one example, the dielectric spacer material layer 420 is composed of a dielectric material such as $SiO_2$.

The dielectric spacer material that provides the dielectric spacer material layer 420 may be provided by a deposition process including, for example, ALD, chemical vapor deposition (CVD), plasma enhanced chemical vapor deposition (PECVD), or physical vapor deposition (PVD). The etch used to provide the dielectric spacer material layer may comprise a dry etching process such as, for example, reactive ion etching.

Recesses may be formed within the semiconductor material stack, creating the formation of nanosheet stacks of alternating nanosheets of sacrificial semiconductor material layers 240 and semiconductor channel material layers 250 that are under at least one sacrificial gate structure 320 and dielectric spacer material layer 420.

The nanosheet stack is formed by removing physically exposed portions of the semiconductor material stack (sacrificial semiconductor material layer 250, semiconductor channel material layer 280) and portions of semiconductor layer 230 that are not protected by the least one sacrificial gate structure 320 and the dielectric spacer material layer 420. In general, each recess may include the eventual location of sidewall spacer 510, etch stop layer 610, buffer layer 620, and source/drain region 710, for the semiconductor device.

The removing of the portions of the semiconductor material stack (sacrificial semiconductor material layer 240, semiconductor channel material layer 250) and the portions of semiconductor layer 230 not covered by the least one sacrificial gate structure and the dielectric spacer material layer 420 can be performed utilizing an anisotropic etching process such as, for example, reactive ion etching (RIE).

Portions of the semiconductor material stack (sacrificial semiconductor material layer 240, semiconductor channel material layer 250) remain beneath at least one sacrificial gate structure 320 and the dielectric spacer material layer 420. The remaining portion of the semiconductor material stack that is present beneath the at least one sacrificial gate structure 320 and the dielectric spacer material layer 420 is referred to as a nanosheet stack.

Each nanosheet stack includes alternating nanosheets of remaining portions of each sacrificial semiconductor material layer 240 and remaining portions of each semiconductor channel material layer 250. Each nanosheet (i.e., sacrificial semiconductor material layer 240 or semiconductor channel material layer 250) that constitutes the nanosheet stack has a thickness as mentioned above for the individual sacrificial semiconductor material layers 240 and semiconductor channel material layers 250, and a width from thirty nm to two hundred nm. In some embodiments, the sidewalls of each sacrificial semiconductor material layer 240 are vertically aligned to sidewalls of each semiconductor channel material layer 250, and the vertically aligned sidewalls of the nanosheet stack are vertically aligned to an outmost sidewall of the dielectric spacer material layer 420.

The sacrificial semiconductor material layer 240 is recessed and inner spacer 410 is formed. Each recessed sacrificial semiconductor material layer 240 has a width that is less than the original width of each sacrificial semiconductor material layer 240. The recessing of each sacrificial semiconductor material layer 240 provides a gap between each neighboring pair of semiconductor channel material layer 250 within a given nanosheet stack. The recessing of each sacrificial semiconductor material layer 240 may be performed utilizing a lateral etching process that is selective in removing physically exposed end portions of each sacrificial semiconductor material layer 240 relative to each semiconductor channel material layer 250.

The additional dielectric spacer material that is added can be compositionally the same as the dielectric spacer material layer 420 mentioned above. In one example, the additional dielectric spacer material and the dielectric spacer material layer 420 are both composed of silicon nitride. For clarity, the additional dielectric spacer material and the dielectric spacer material layer 420 can now be collectively referred to as inner spacer 410. The inner spacer 410 is formed by a conformal dielectric liner deposition followed by isotropic etching back the deposited liner.

Figure 5A:
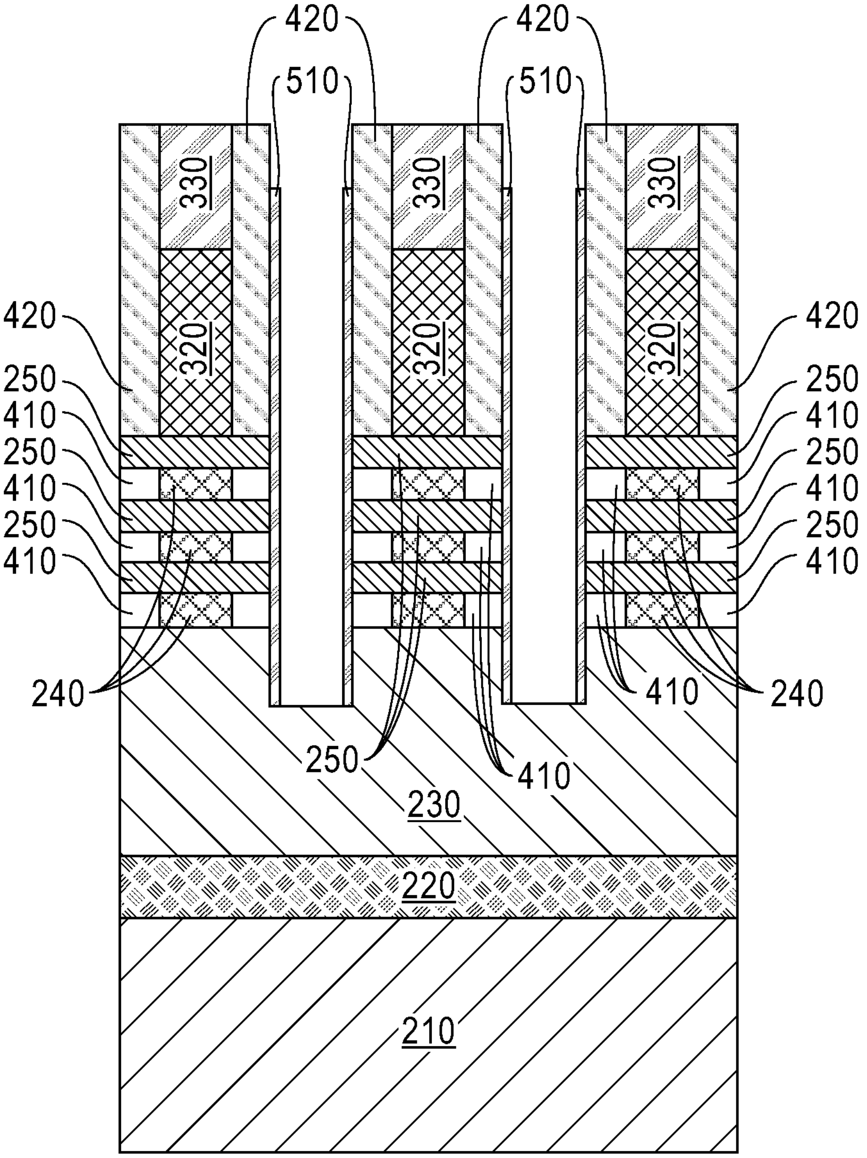
FIG. 5A depicts a cross-sectional view, along section line A of FIG. 1.
Figure 5C:
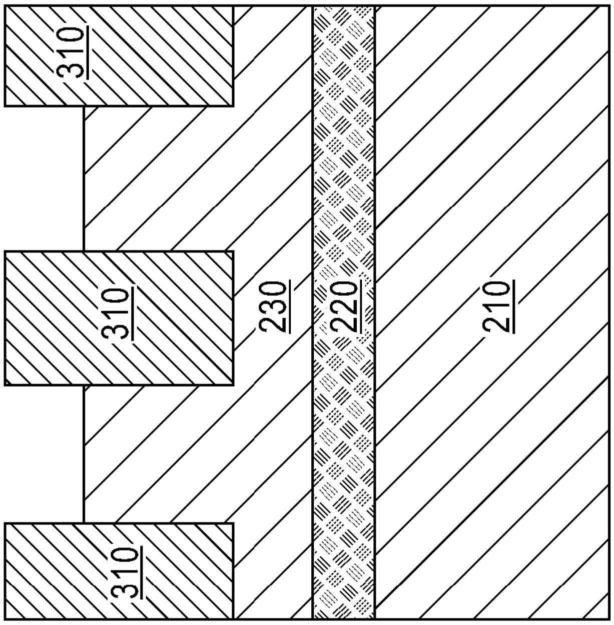
FIG. 5C depicts a cross-sectional view, along section line C of FIG. 1, of a process of forming a sidewall spacer, in accordance with an embodiment of the present invention.
Figure 5B:
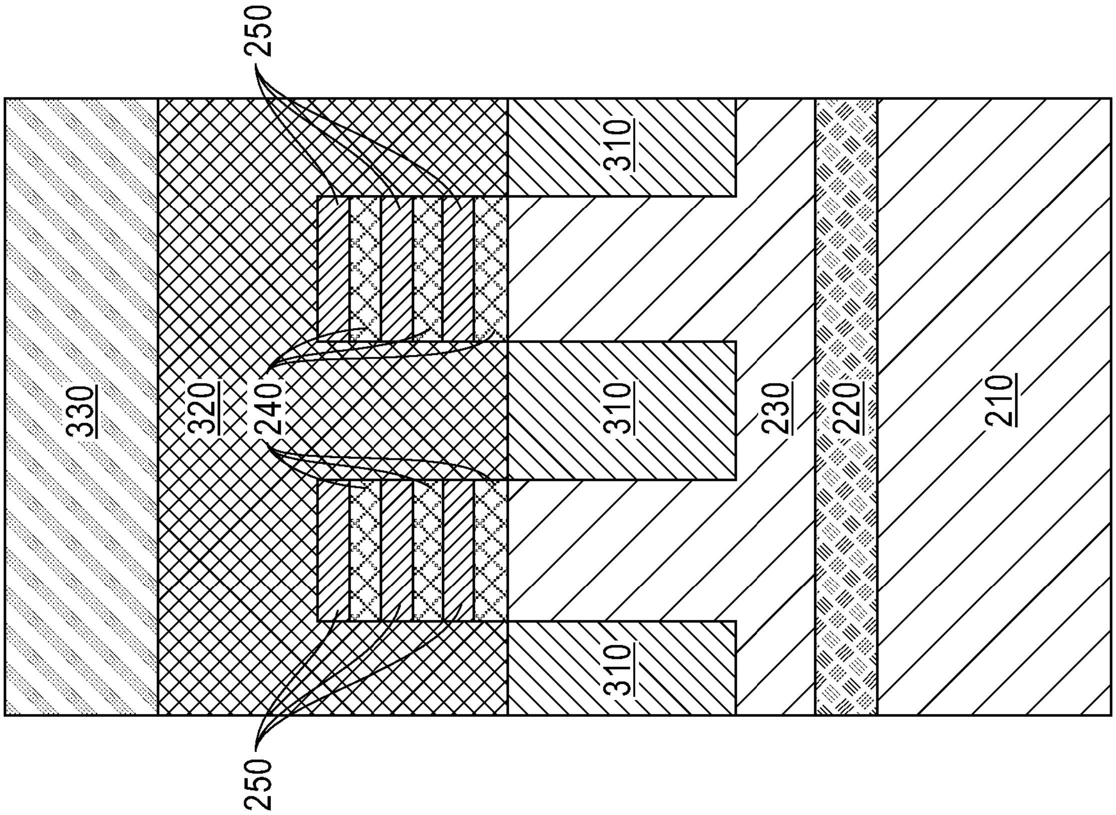
FIG. 5B depicts a cross-sectional view, along section line B of FIG. 1.

FIG. 5A depicts a cross-sectional view, of fabrication steps, along section line A of FIG. 1, FIG. 5B depicts a cross-sectional view along section line B of FIG. 1, and FIG. 5C depicts a cross-sectional view along section line C of FIG. 1. FIGS. 5A-5C depict the formation of sidewall spacer 510.

Sidewall spacer 510 can be formed on exposed sidewalls of each semiconductor layer 230, each inner spacer 410, each semiconductor channel material layer 250, and each dielectric spacer material layer 420. In some embodiments, sidewall spacer 510 is formed such that upper portions of dielectric spacer material layer 420 remain exposed. The sidewall spacer 510 can be formed by first providing a dielectric spacer material and then etching the dielectric spacer material. One example of a dielectric spacer material that may be employed in the present application is silicon nitride (SiN). In general, the sidewall spacer 510 comprises any dielectric spacer material, including, for example, a dielectric nitride, dielectric oxide, and/or dielectric oxynitride. More specifically, the sidewall spacer 510 may be, for example, SiBCN, SiBN, SiOCN, SiON, SiCO, or SiC. In one example, the sidewall spacer 510 is composed of a dielectric material such as $SiO_2$.

The dielectric spacer material that provides the sidewall spacer 510 may be provided by a deposition process including, for example, ALD, chemical vapor deposition (CVD), plasma enhanced chemical vapor deposition (PECVD), or physical vapor deposition (PVD). The etch used to provide the dielectric spacer material layer may comprise a dry etching process such as, for example, reactive ion etching.

Figure 6A:
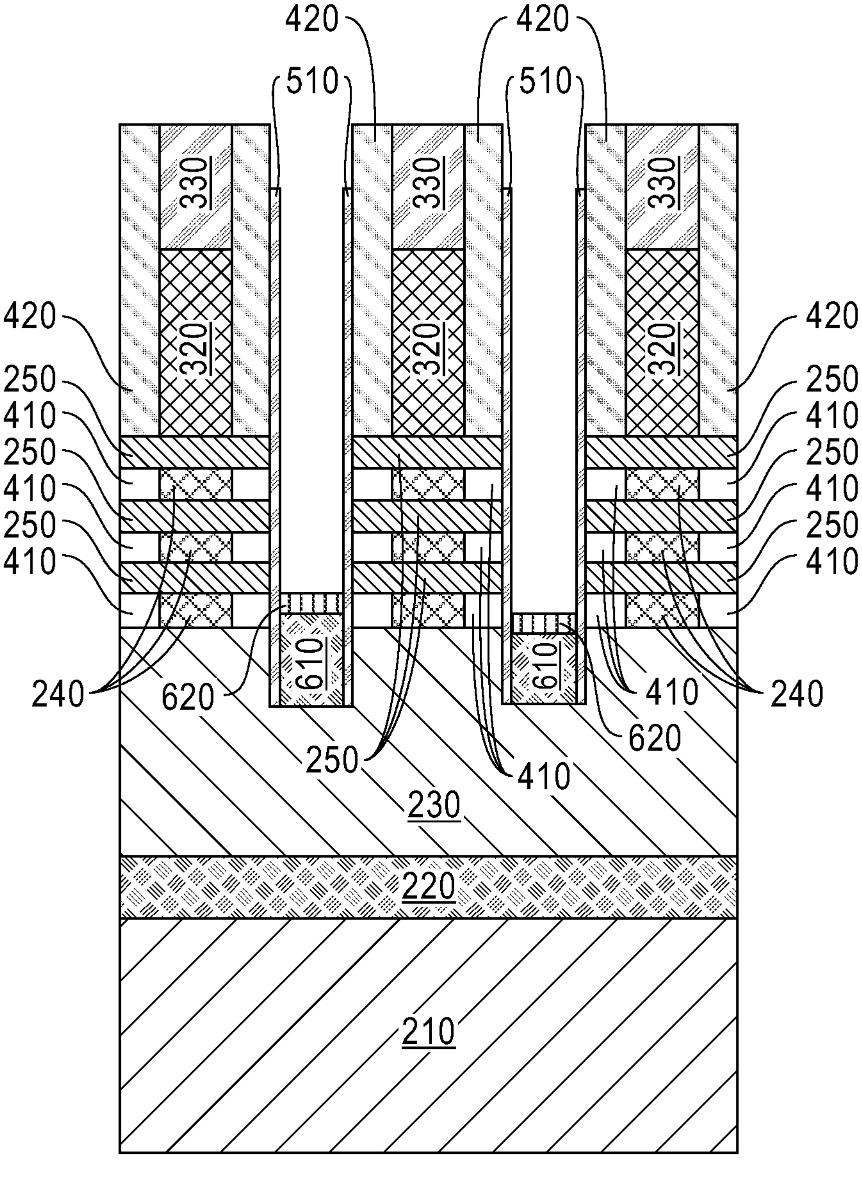
FIG. 6A depicts a cross-sectional view, along section line A of FIG. 1.
Figure 6C:
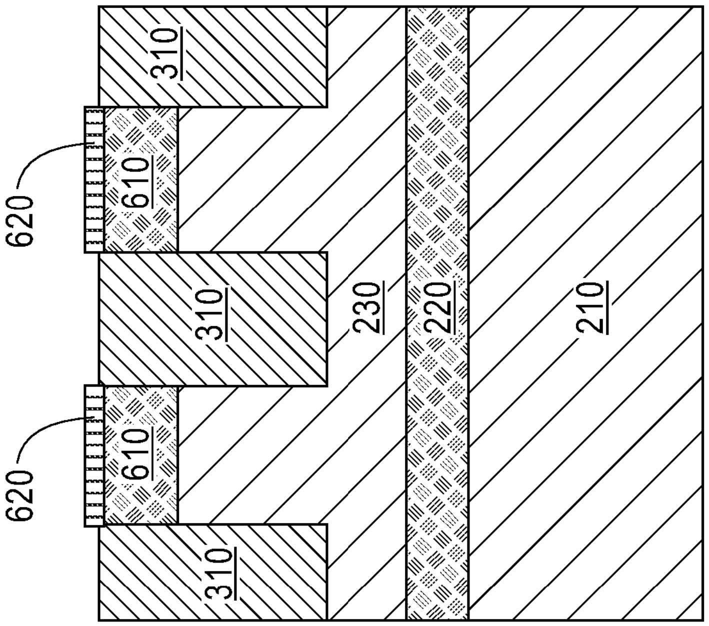
FIG. 6C depicts a cross-sectional view, along section line C of FIG. 1, of a process of forming an etch stop layer and a buffer layer, in accordance with an embodiment of the present invention.
Figure 6B:
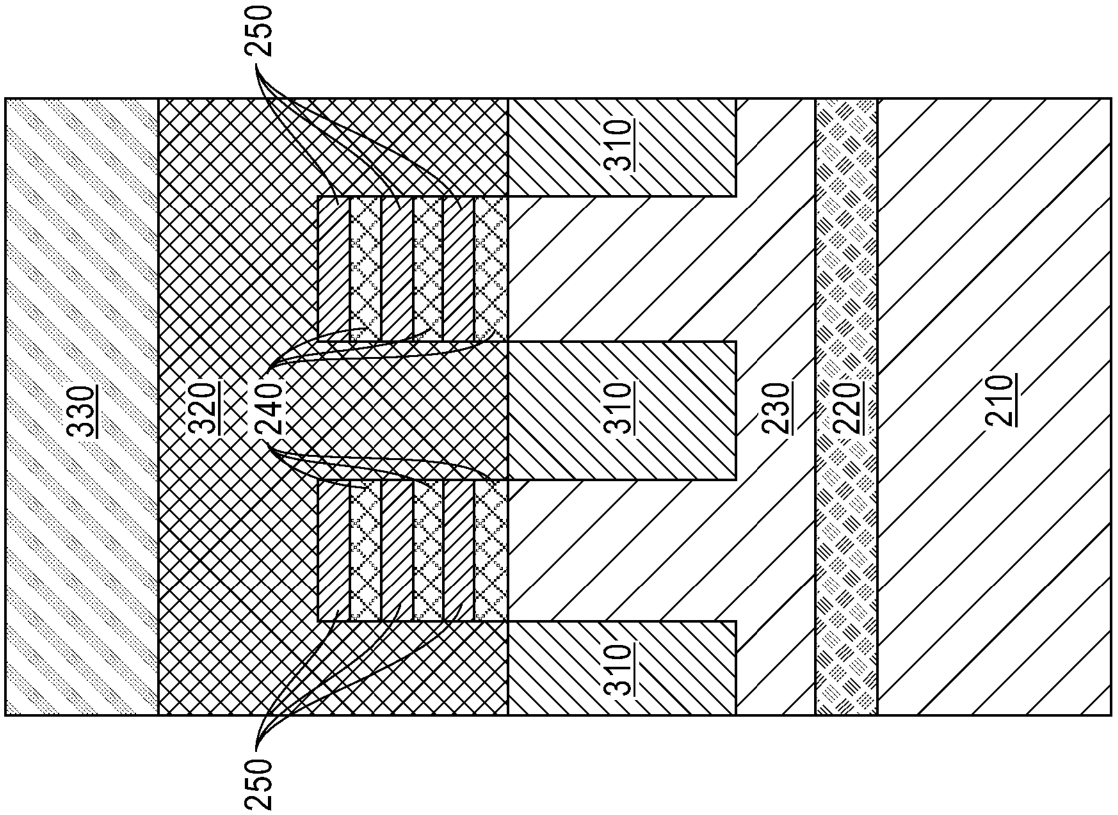
FIG. 6B depicts a cross-sectional view, along section line B of FIG. 1.

FIG. 6A depicts a cross-sectional view, of fabrication steps, along section line A of FIG. 1, FIG. 6B depicts a cross-sectional view along section line B of FIG. 1, and FIG. 6C depicts a cross-sectional view along section line C of FIG. 1. FIGS. 6A-6C depicts the formation of etch stop layer 610 and buffer layer 620.

Etch stop layer 610 is present on exposed surfaces of semiconductor layer 230 and between sidewall spacers 510. Etch stop layer 610 acts as a placeholder to protect source/drain region 710 during backside contact formation.

Etch stop layer 610 may be composed of, for example, silicon dioxide or epitaxy SiGe. Etch stop layer 610 is, in general, composed of a semiconductor material which differs in composition from the semiconductor layer 230. In one embodiment, etch stop layer 610 is composed of silicon germanium with Ge % 20% to 35%. Etch stop layer 610 can be formed utilizing epitaxial growth from semiconductor layer 230.

The epitaxial growth of the semiconductor materials that provide the etch stop layer 610 can be performed utilizing any well-known precursor gas or gas mixture. Carrier gases like hydrogen, nitrogen, helium and argon can be used.

As depicted, there are slight variations in the growth of the semiconductor material that comprises etch stop layer 610. Embodiments of the present invention recognize that a benefit to the approach and resulting structure described by various embodiments of the present invention is that it is acceptable to have some variation in the growth height of etch stop layer 610. In some embodiments, there will not be variations in the growth height of etch stop layer 610 and the depiction in FIG. 6A is merely presented as an example.

Buffer layer 620 is formed on etch stop layer 610. Buffer layer 620 is composed of a semiconductor material which differs in composition from etch stop layer 610. In one embodiment, buffer layer 620 is composed of silicon. Buffer layer 620 can be formed utilizing epitaxial growth from etch stop layer 610.

The epitaxial growth of the semiconductor materials that provide the buffer layer 620 can be performed utilizing any well-known precursor gas or gas mixture. Carrier gases like hydrogen, nitrogen, helium and argon can be used.

Figure 7A:
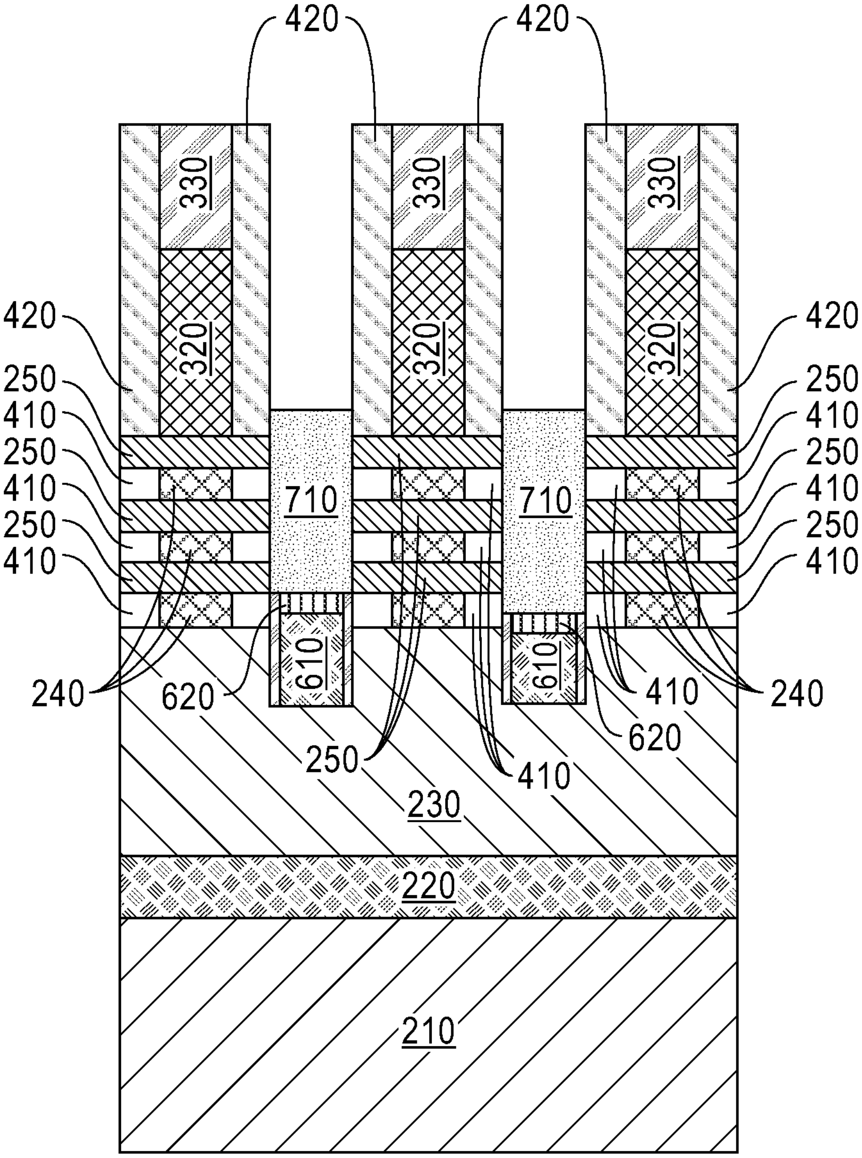
FIG. 7A depicts a cross-sectional view, along section line A of FIG. 1.
Figure 7B:
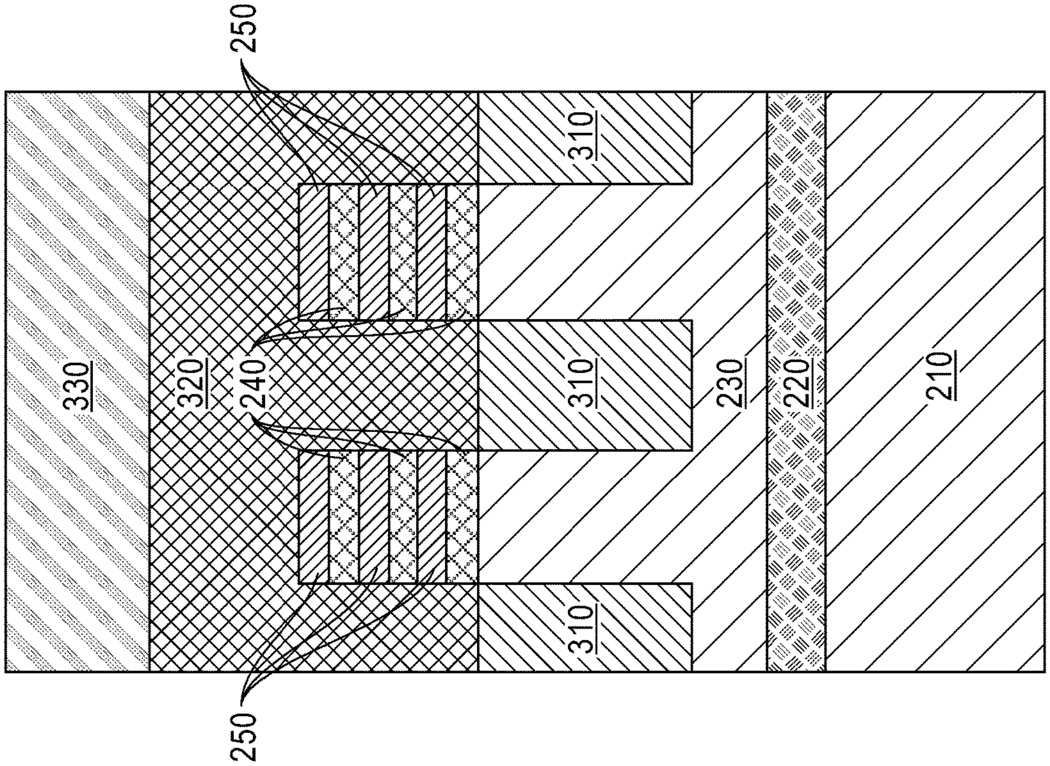
FIG. 7B depicts a cross-sectional view, along section line B of FIG. 1.
Figure 7C:
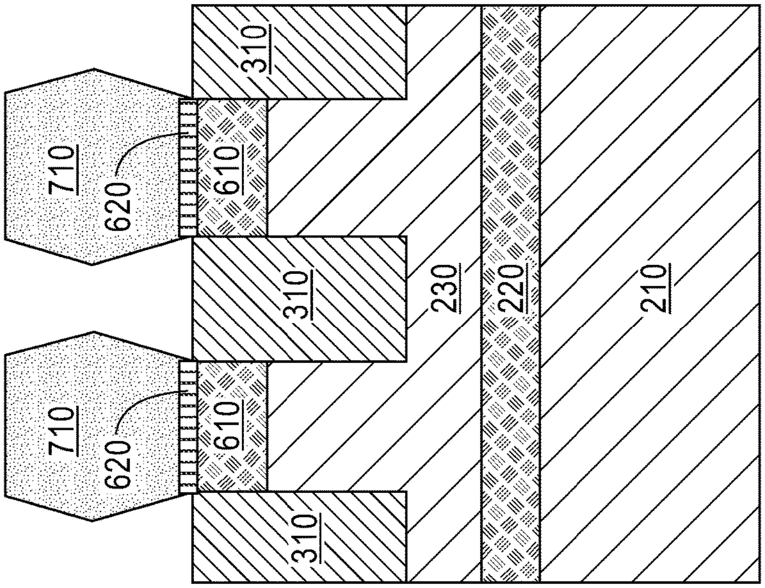
FIG. 7C depicts a cross-sectional view, along section line C of FIG. 1, of a process of removing exposed portions of sidewalls spacers and forming a source/drain region, in accordance with an embodiment of the present invention.

FIG. 7A depicts a cross-sectional view, of fabrication steps, along section line A of FIG. 1, FIG. 7B depicts a cross-sectional view along section line B of FIG. 1, and FIG. 7C depicts a cross-sectional view along section line C of FIG. 1. FIGS. 7A-7C depict the removal of exposed portions of sidewall spacers 510 and the formation of source/drain region 710.

Exposed portions of sidewall spacers 510 may be removed by an etching process, such as RIE, wet etch, or any etch process which can be used to selectively etch sidewall spacers 510 relative to dielectric spacer material layer 420, sacrificial dielectric cap 330, and buffer layer 620.

Source/drain region 710 is formed by epitaxial growth of a semiconductor material on physically exposed sidewalls of each semiconductor channel material layer 250. The source/drain region 710 has a bottommost surface that directly contacts a topmost surface of buffer layer 620.

Each source/drain region 710 includes a semiconductor material and a dopant. The semiconductor material that provides each source/drain region 710 can be selected from one of the semiconductor materials mentioned above for the semiconductor substrate 210. In some embodiments, the semiconductor material that provides each source/drain region 710 may comprise a same semiconductor material as that which provides semiconductor channel material layer 250. In other embodiments, the semiconductor material that provides each source/drain region 710 may comprise a different semiconductor material than that which provides semiconductor channel material layer 250. For example, the semiconductor material that provides each source/drain region 710 may comprise a silicon germanium alloy, while semiconductor channel material layer 250 may comprise silicon.

The dopant that is present in each source/drain region 710 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one embodiment, the dopant that can be present in each source/drain region 710 can be introduced into the precursor gas that provides each source/drain region 710. In another embodiment, the dopant can be introduced into an intrinsic semiconductor layer by utilizing one of ion implantation or gas phase doping. In one example, each source/drain region 710 comprises a silicon germanium alloy that is doped with a p-type dopant such as, for example, boron. As mentioned above, each source/drain region 710 is formed by an epitaxial growth (or deposition) process, as is defined above.

Figure 8A:
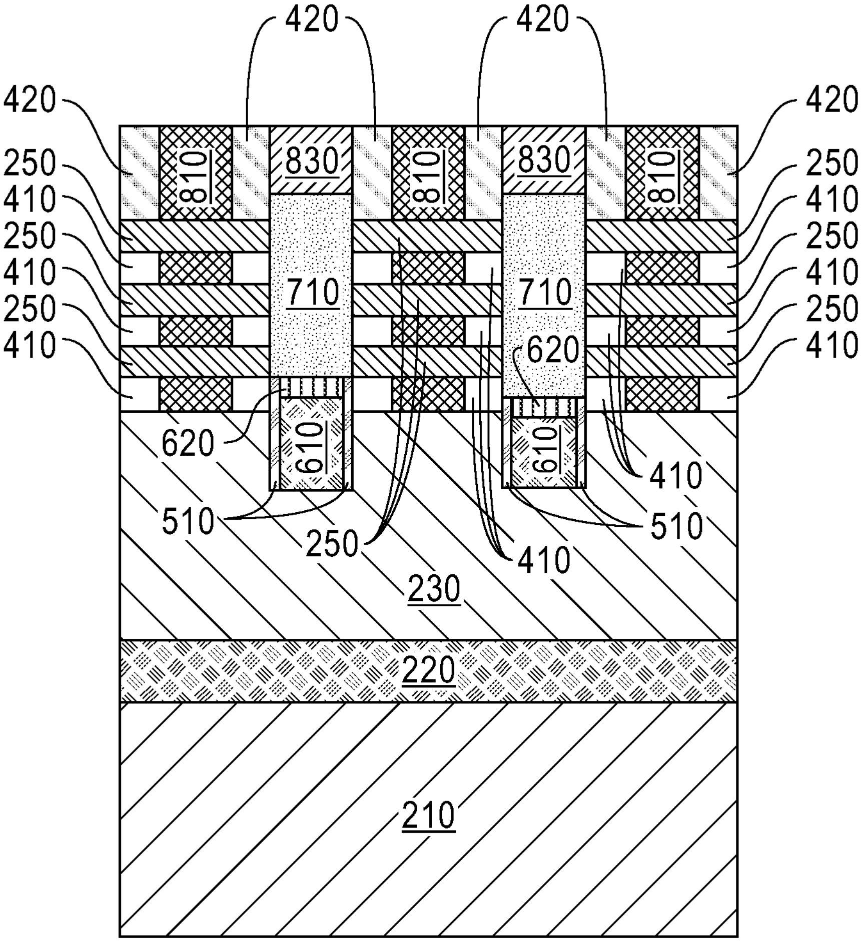
FIG. 8A depicts a cross-sectional view, along section line A of FIG. 1.
Figure 8C:
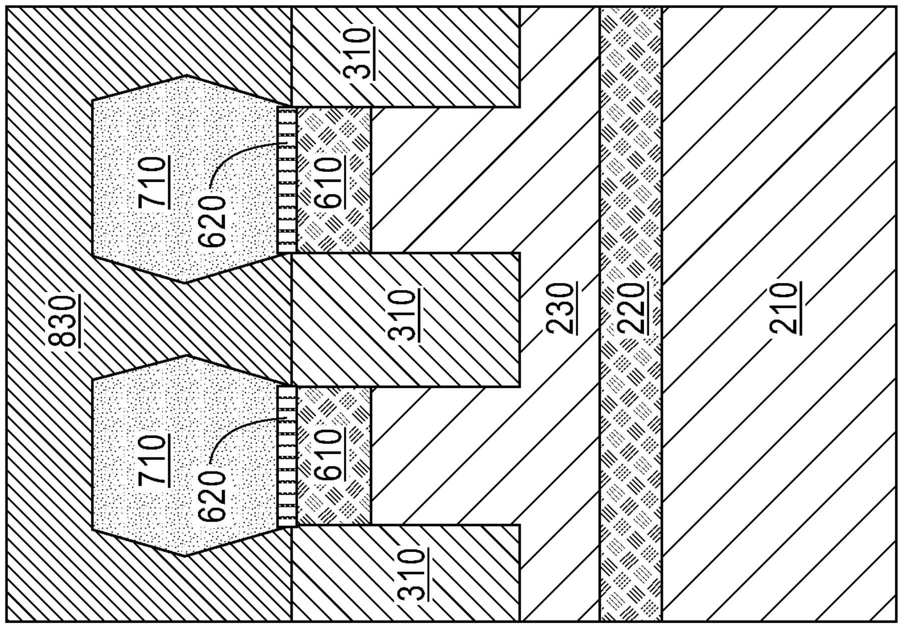
FIG. 8C depicts a cross-sectional view, along section line C of FIG. 1, of a process of forming ILD material and gate cuts, removing the sacrificial gate structure and sacrificial dielectric cap, and forming a functional gate structure, in accordance with an embodiment of the present invention.
Figure 8B:
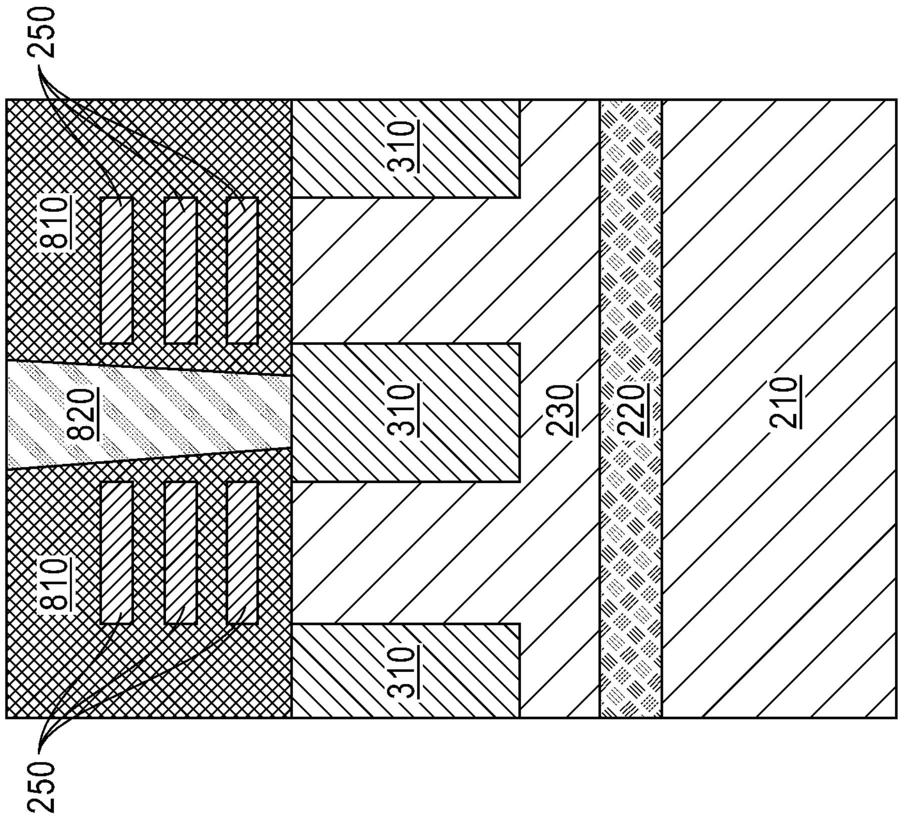
FIG. 8B depicts a cross-sectional view, along section line B of FIG. 1.

FIG. 8A depicts a cross-sectional view, of fabrication steps, along section line A of FIG. 1, FIG. 8B depicts a cross-sectional view along section line B of FIG. 1, and FIG. 8C depicts a cross-sectional view along section line C of FIG. 1. FIGS. 8A-8C depict the formation of ILD material 830 and gate cuts 820, the removal of sacrificial gate structure 320 and sacrificial dielectric cap 330, and the formation of a functional gate structure that is referred to as replacement gate 810.

ILD material 830 is formed above and around each source/drain region 710. ILD material 830 may be composed of silicon dioxide, undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. The term "low-κ" as used throughout the present application denotes a dielectric material that has a dielectric constant of less than silicon dioxide. In another embodiment, a self-planarizing material such as a spin-on glass (SOG) or a spin-on low-κ dielectric material such as SiLK™ can be used as ILD material 830. The use of a self-planarizing dielectric material as ILD material 830 may avoid the need to perform a subsequent planarizing step.

In one embodiment, ILD material 830 can be formed utilizing a deposition process including, for example, CVD, plasma enhanced chemical vapor deposition (PECVD), evaporation or spin-on coating. In some embodiments, particularly when non-self-planarizing dielectric materials are used as ILD material 830, a planarization process, such as CMP, or an etch back process follows the deposition of the dielectric material that provides ILD material 830. As is shown in FIGS. 8A-8C, ILD material 275 that is present atop each source/drain region 710 has a topmost surface that is coplanar to a topmost surface of dielectric spacer material layer 420. In some embodiments, portions of dielectric spacer material layer 420 are also removed via the planarization process or etch back process that follows the deposition of the dielectric material that provides ILD material 830.

Each sacrificial gate structure (i.e., sacrificial gate structure 320 and sacrificial dielectric cap 330) is removed to provide a gate cavity for the FET.

Next, each semiconductor channel material nanosheet (i.e., semiconductor channel material layer 250) of the FET is suspended by selectively etching each recessed sacrificial semiconductor material nanosheet (i.e., sacrificial semiconductor material layer 240 relative to each semiconductor channel material nanosheet (i.e., semiconductor channel material layer 250).

Functional gate structures are formed in each gate cavity. The functional gate structure surrounds a physically exposed surface of each semiconductor channel material nanosheet (i.e., semiconductor channel material layer 250). By "functional gate structure" it is meant a permanent gate structure used to control output current (i.e., flow of carriers in the channel) of a semiconducting device through electrical or magnetic fields. The functional gate structures are referred to as replacement gate 810 in the Figures.

While not depicted, in some embodiments, a gate dielectric portion may be present that includes a gate dielectric material. Such a gate dielectric portion may be an oxide, nitride, and/or oxynitride. In one example, the gate dielectric portion can be a high-material having a dielectric constant greater than silicon dioxide. Example high-K dielectrics include, but are not limited to, HfO2, ZrO2, La2O3, Al2O3, TiO2, SrTiO3, LaAlO3, Y2O3, HfOxNy, ZrOxNy, La2OxNy, Al2OxNy, TiOxNy, SrTiOxNy, LaAlOxNy, Y2OxNy, SiON, SiNx, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-K gate dielectric, can be formed and used as the gate dielectric portion.

The gate dielectric material used in providing a gate dielectric portion can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing a gate dielectric portion can have a thickness in a range from one nm to ten nm. Other thicknesses that are lesser than, or greater than, the aforementioned thickness range can also be employed for the gate dielectric material that may provide a gate dielectric portion.

Replacement gate 810 may include a gate conductor material and a gate dielectric. The gate conductor material used in providing replacement gate 810 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride, TiAIC, TiC. TiAl), an elemental metal silicide (e.g., tungsten silicide, nickel silicide, and titanium silicide), or multilayered combinations thereof. In one embodiment, replacement gate 810 may comprise an nFET gate metal. In another embodiment, replacement gate 810 may comprise a pFET gate metal. When multiple gate cavities are formed, it is possible to form a nFET in a first set of the gate cavities and wrapping around some of the semiconductor channel material nanosheet (i.e., semiconductor channel material layer 250) and a pFET in a second set of the gate cavities and wrapping around some of the semiconductor channel material nanosheet (i.e., semiconductor channel material layer 250).

The gate conductor material used in providing replacement gate 810 can be formed utilizing a deposition process including, for example, CVD, plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing replacement gate 810 can have a thickness from five nm to two hundred nm. Other thicknesses that are lesser than, or greater than, the aforementioned thickness range can also be employed for the gate conductor material used in providing replacement gate 810.

In some embodiments, a functional gate structure (replacement gate 810) can be formed by providing a functional gate material stack of the gate dielectric material and the gate conductor material. A planarization process may follow the formation of the functional gate material stack.

Gate cuts 820 may be patterned by conventional lithography and etch processes to isolate the gate regions at cell boundaries. Each gate cut 820 is filled with a dielectric material such as, for example, SiN or a combination of SiN and SiO2.

Figure 9A:
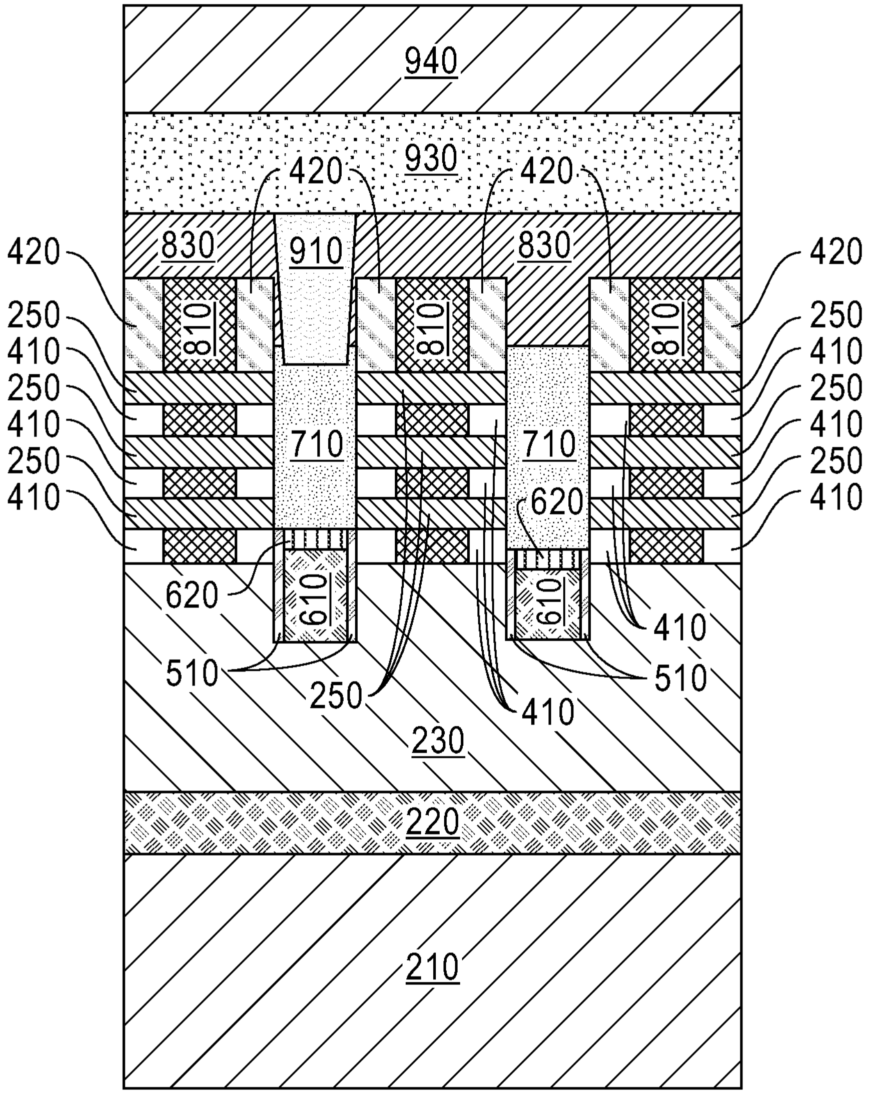
FIG. 9A depicts a cross-sectional view, along section line A of FIG. 1.
Figure 9C:
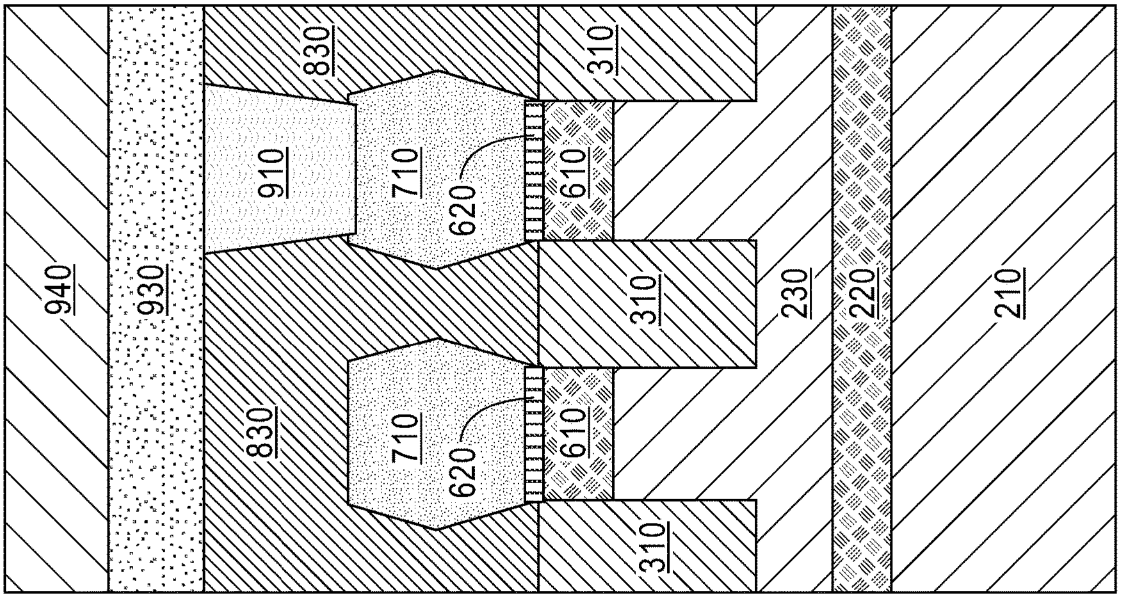
FIG. 9C depicts a cross-sectional view, along section line C of FIG. 1, of a process of forming a source/drain contact, gate contacts, back end of line (BEOL) interconnects, and the bonding of the device to a carrier wafer, in accordance with an embodiment of the present invention.
Figure 9B:
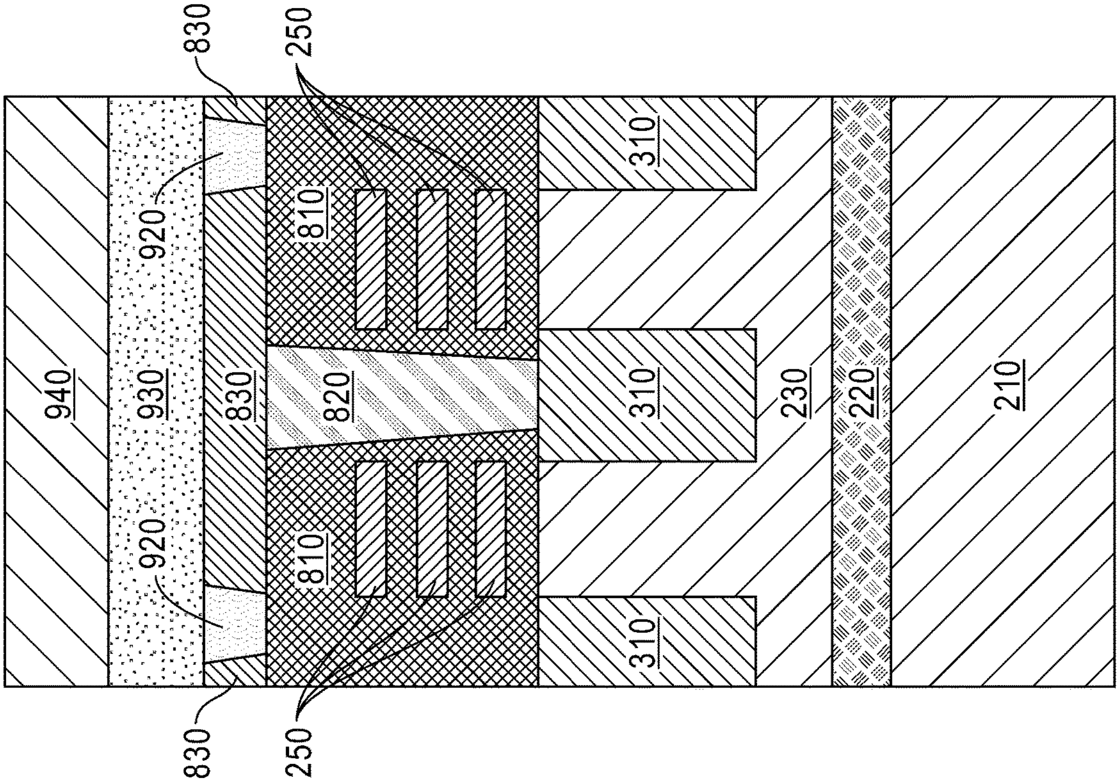
FIG. 9B depicts a cross-sectional view, along section line B of FIG. 1.

FIG. 9A depicts a cross-sectional view, of fabrication steps, along section line A of FIG. 1, FIG. 9B depicts a cross-sectional view along section line B of FIG. 1, and FIG. 9C depicts a cross-sectional view along section line C of FIG. 1. FIGS. 9A-9C depict the formation of source/drain (S/D) contact 910, gate contacts 920, BEOL interconnect 930, and the bonding of the device to carrier wafer 940.

One or more trenches may be formed by lithography and an etching process, such as reactive-ion etching (RIE), laser ablation, or any etch process which can be used to selectively remove a portion of material such as ILD material 830. A hardmask (not shown) may be patterned using photoresist to expose areas of the device where trenches are desired and the hardmask may be utilized during the etching process in the creation of the trenches. The etching process only removes portions of the device not protected by the hardmask and the etching process stops at source/drain region 710 and/or replacement gate 810.

In some embodiments, subsequent to the formation of the trenches, the hardmask is removed. In general, the process of removing the hardmask involves the use of an etching process such as RIE, laser ablation, or any etch process which can be used to selectively remove a portion of material, such as the hardmask. In some embodiments, prior to the removal of the hardmask, the photoresist (not shown) is removed. The process of removing the photoresist is similar to that of the process of removing the hardmask.

In general, S/D contact 910 is formed and makes contact with source/drain region 710. Gate contacts 920 are formed and each make contact with a replacement gate 810.

S/D contact 910 and gate contacts 920 may each be formed by metal deposition and planarization. The metal layers comprise a silicide liner, such as, for example, Ti, Ni, or NiPt, followed by adhesion metal liner, such as, for example, TiN, and a conductive metal fill, such as, for example, Co, Ru, W, or Cu.

Each S/D contact 910 and gate contact 920 can be formed utilizing a deposition process including, for example, CVD, PECVD, physical vapor deposition (PVD), sputtering, atomic layer deposition (ALD) or other like deposition processes.

BEOL interconnect 930 is depicted as a simple layer, rather than showing the specific interconnects. BEOL interconnect 930 may be formed according to processes known in the art such as, for example, patterning and dual damascene.

Carrier wafer 940 is a wafer that is bonded with a top surface of BEOL interconnect 930. Carrier wafer 940 may be, for example, a silicon wafer. Such bonding can be accomplished using fusion bonding (for example silicon oxide to silicon oxide) or by means of intermediate-layer bonding (for example using adhesives). A variety of bonding means may be used such as, for example, pressure bonding, for press-bonding the device to the carrier wafer 940 or a heat bonding approach for utilizing heat to bond the device to carrier wafer 940.

Subsequent to bonding the device to carrier wafer 940, the device is flipped upside-down such that the formation or removal of any layers occurs on what is considered to be the bottom of the device. This flip is not depicted in the Figures and, accordingly, FIGS. 10A-10C through FIGS. 19A-19C depict process steps that occur on the bottom surfaces of the device. In reality, during fabrication, these steps are performed when the device is upside-down, as compared to the depiction of FIGS. 10A-10C through FIGS. 19A-19C.

Figure 10A:
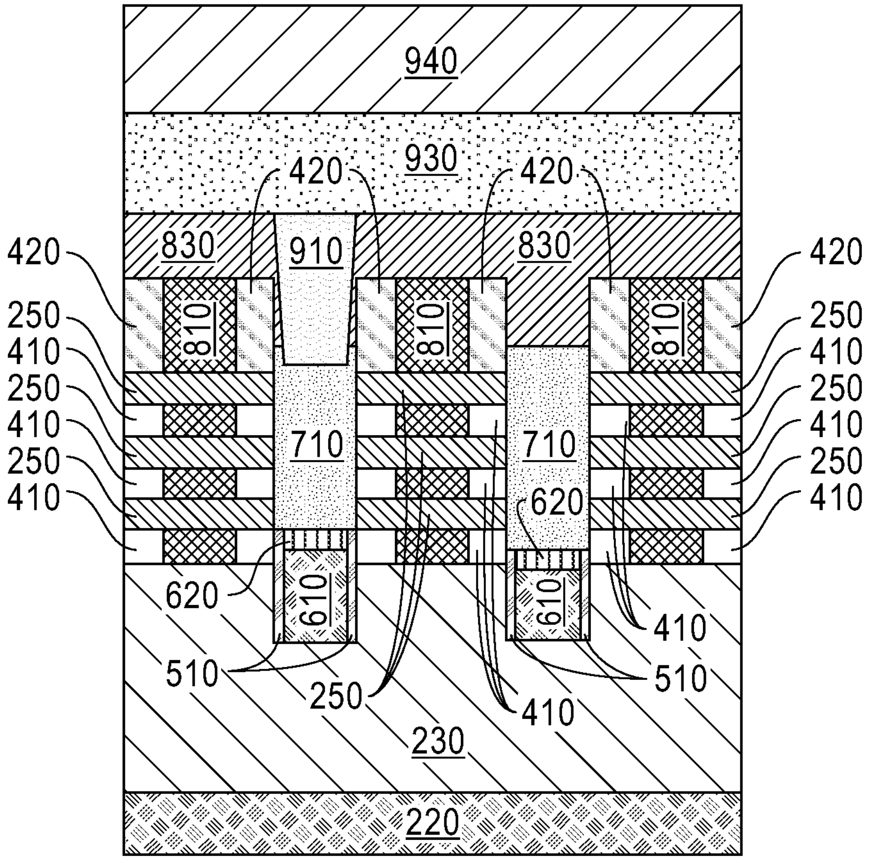
FIG. 10A depicts a cross-sectional view, along section line A of FIG. 1.
Figure 10C:
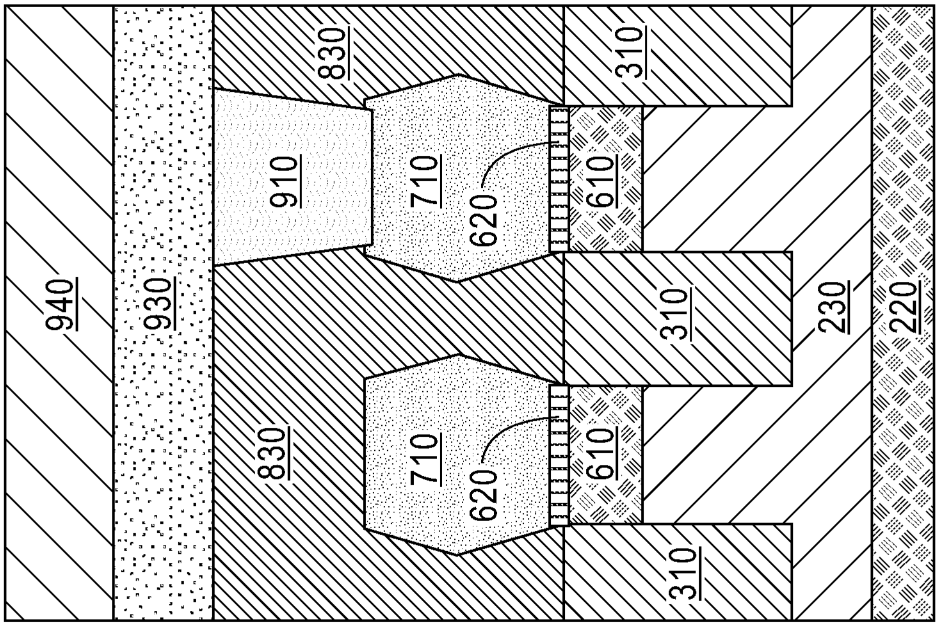
FIG. 10C depicts a cross-sectional view, along section line C of FIG. 1, of a process of removing the semiconductor substrate, in accordance with an embodiment of the present invention.
Figure 10B:
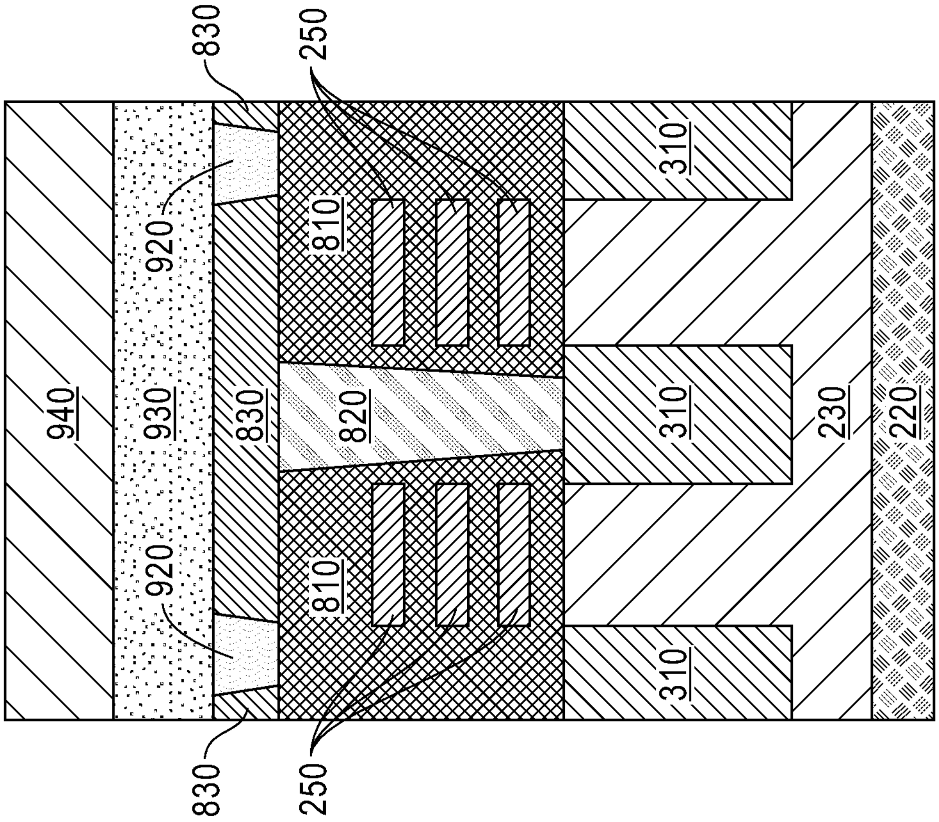
FIG. 10B depicts a cross-sectional view, along section line B of FIG. 1.

FIG. 10A depicts a cross-sectional view, of fabrication steps, along section line A of FIG. 1, FIG. 10B depicts a cross-sectional view along section line B of FIG. 1, and FIG. 10C depicts a cross-sectional view along section line C of FIG. 1. FIGS. 10A-10C depict the removal of semiconductor substrate 210.

As described above, prior to this step, the wafer containing device is flipped such that a top surface of the wafer faces downwards and the carrier wafer 940 acts as a bottom surface of the flipped device.

A combination of processes, such as wafer grinding, CMP, and/or wet/dry etch processes may be used to remove semiconductor substrate 210, stopping at etch stop layer 220.

Figure 11A:
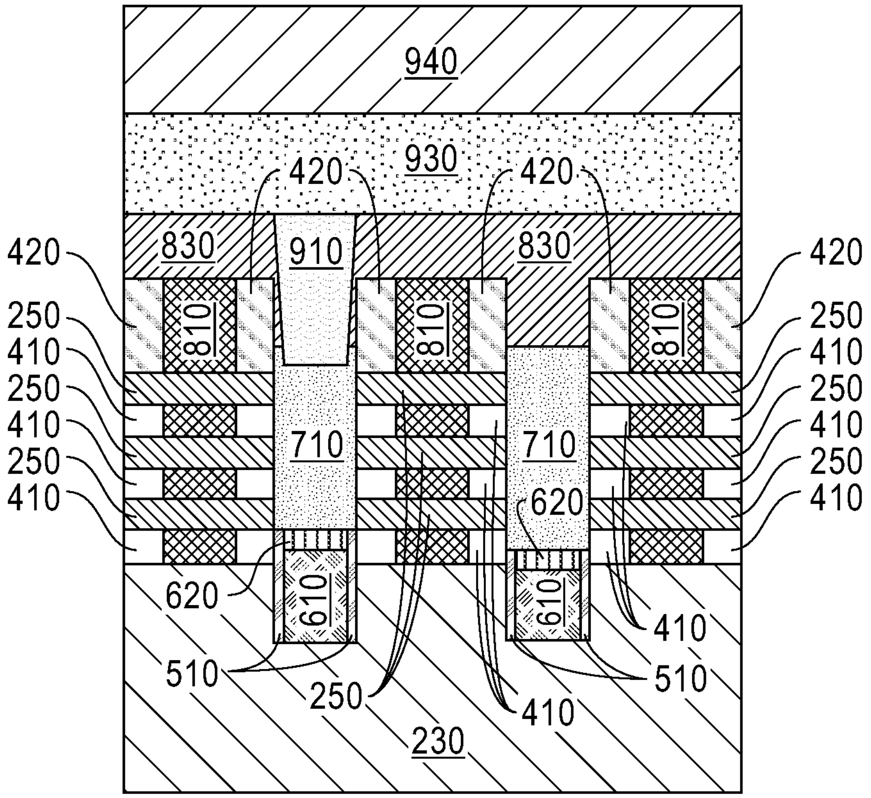
FIG. 11A depicts a cross-sectional view, along section line A of FIG. 1.
Figure 11B:
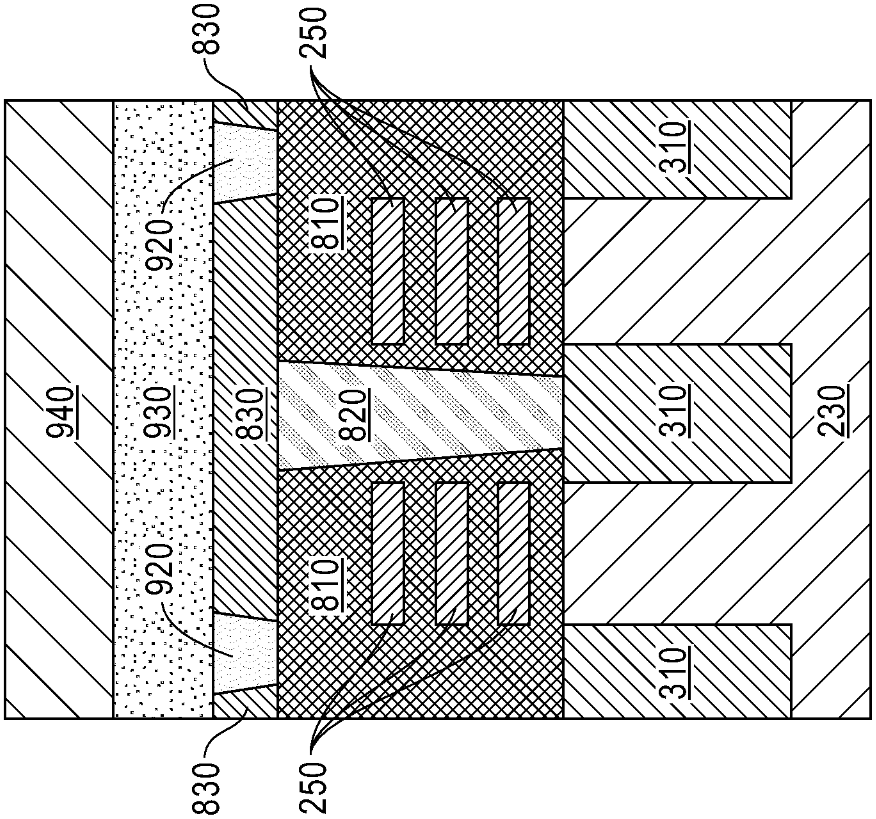
FIG. 11B depicts a cross-sectional view, along section line B of FIG. 1.
Figure 11C:
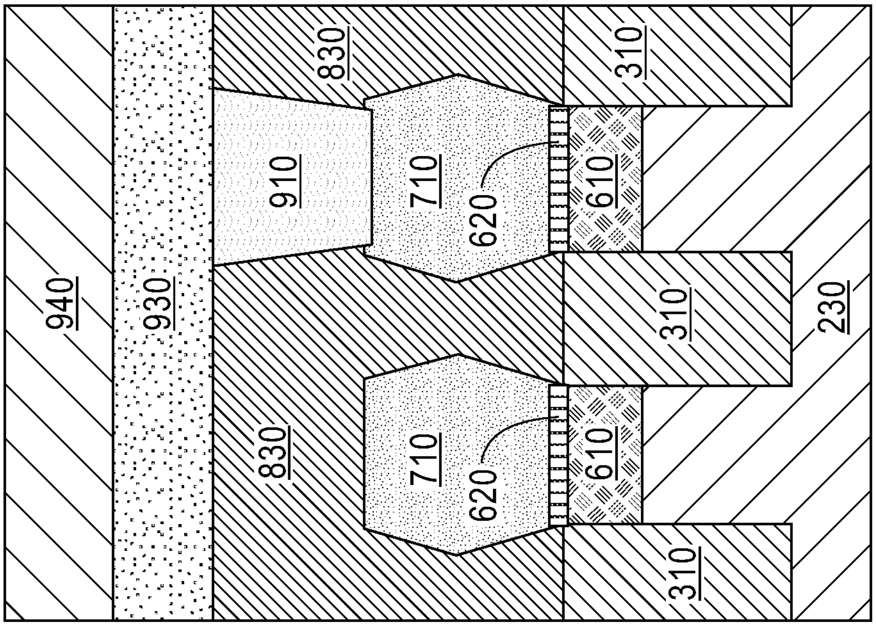
FIG. 11C depicts a cross-sectional view, along section line C of FIG. 1, of a process of removing the etch stop layer, in accordance with an embodiment of the present invention.

FIG. 11A depicts a cross-sectional view, of fabrication steps, along section line A of FIG. 1, FIG. 11B depicts a cross-sectional view along section line B of FIG. 1, and FIG. 11C depicts a cross-sectional view along section line C of FIG. 1. FIGS. 11A-11C depict the removal of etch stop layer 220.

A selective wet or dry etch process is performed to remove etch stop layer 220.

Figure 12A:
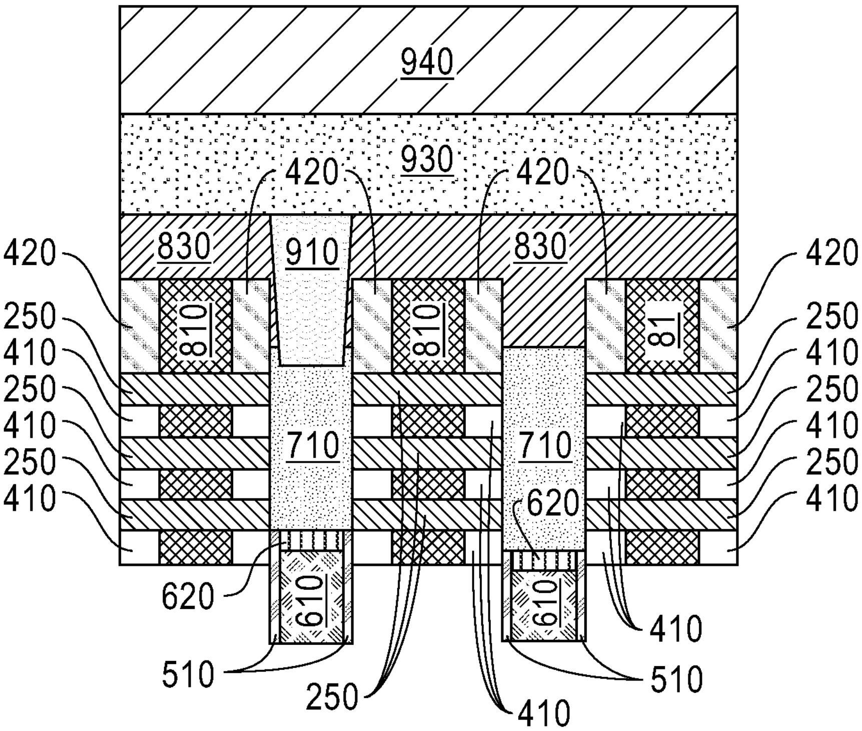
FIG. 12A depicts a cross-sectional view, along section line A of FIG. 1.
Figure 12C:
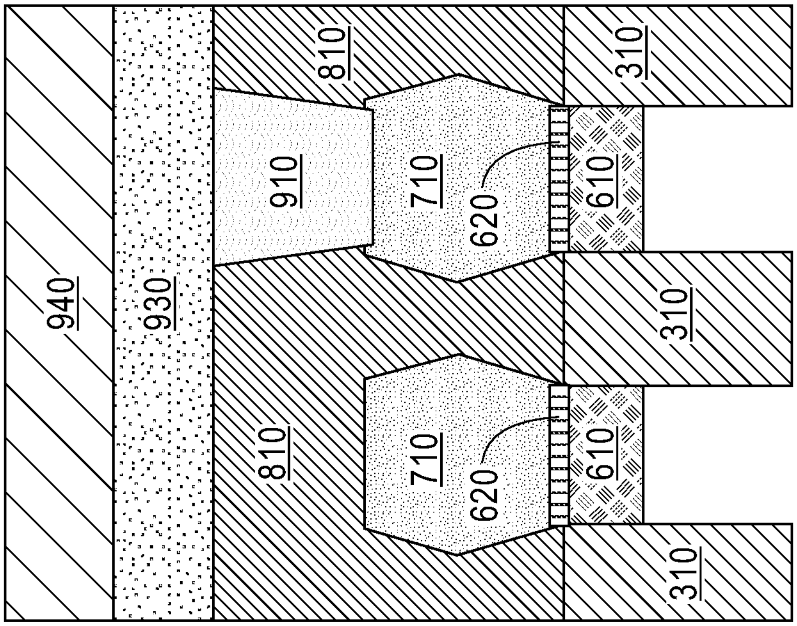
FIG. 12C depicts a cross-sectional view, along section line C of FIG. 1, of a process of removing the semiconductor layer, in accordance with an embodiment of the present invention.
Figure 12B:
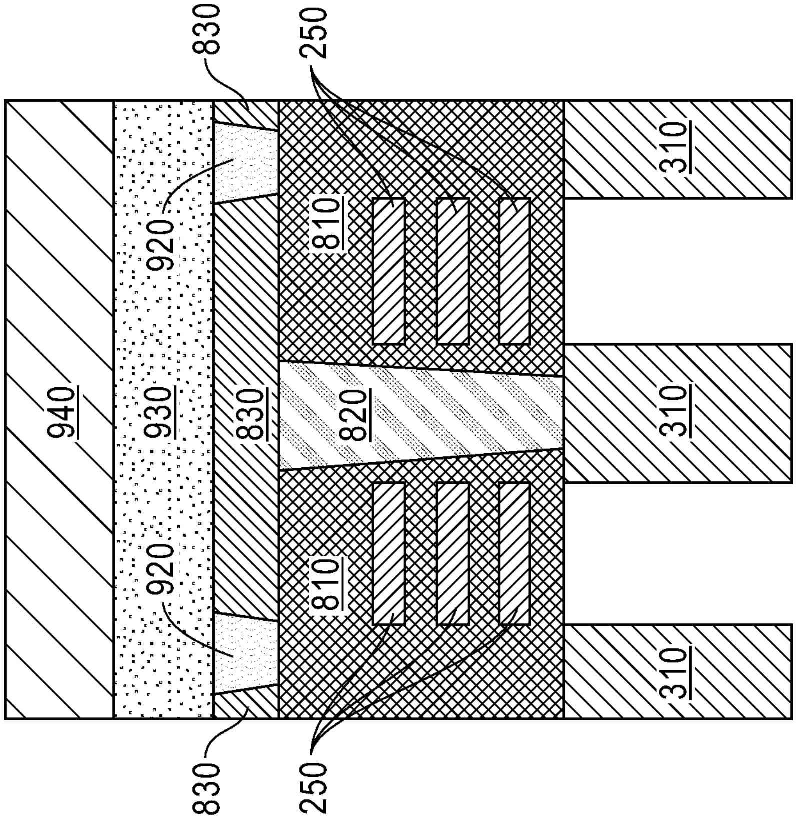
FIG. 12B depicts a cross-sectional view, along section line B of FIG. 1.

FIG. 12A depicts a cross-sectional view, of fabrication steps, along section line A of FIG. 1, FIG. 12B depicts a cross-sectional view along section line B of FIG. 1, and FIG. 12C depicts a cross-sectional view along section line C of FIG. 1. FIGS. 12A-12C depict the removal of semiconductor layer 230.

Semiconductor layer 230 is removed using an etching process such as RIE, wet etch, or any etch process which can be used to selectively remove a portion of material, such as the semiconductor layer 230, with respect to STI layer 310, inner spacers 410, sidewall spacers 510, etch stop layer 610, and replacement gate 810. In some embodiments, such a process selectively removes silicon with respect to Hf02, SiN, and SiGe. In some embodiments, a backside ammonia wet etch is utilized.

Embodiments of the present invention recognize that damage to source/drain region 710 is prevented due to, at least the presence of sidewall spacers 510 and/or etch stop layer 610.

Figure 13A:
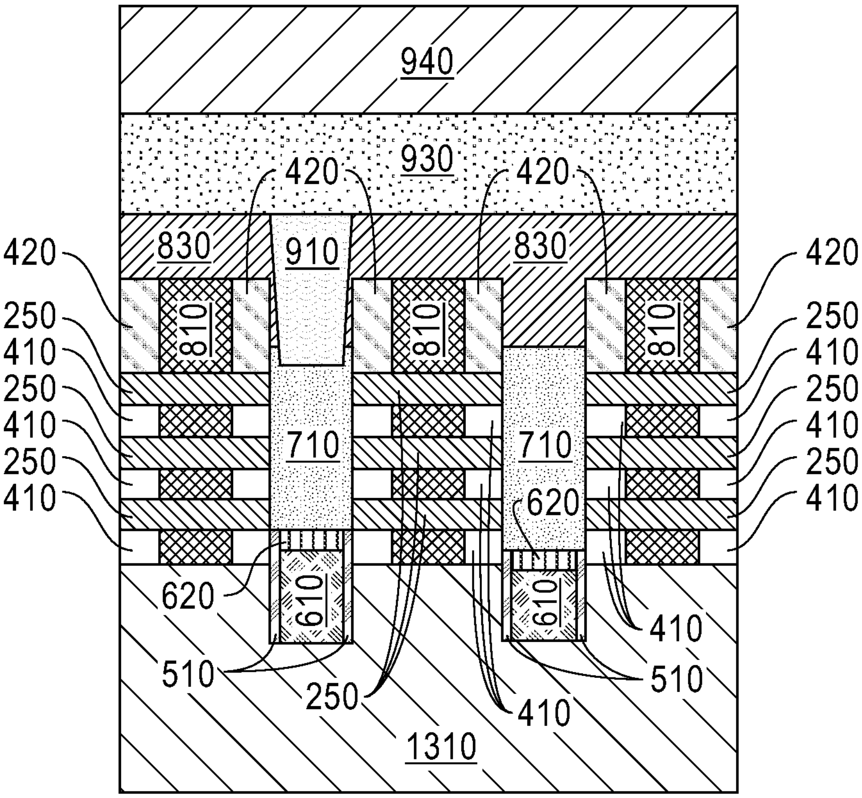
FIG. 13A depicts a cross-sectional view, along section line A of FIG. 1.
Figure 13B:
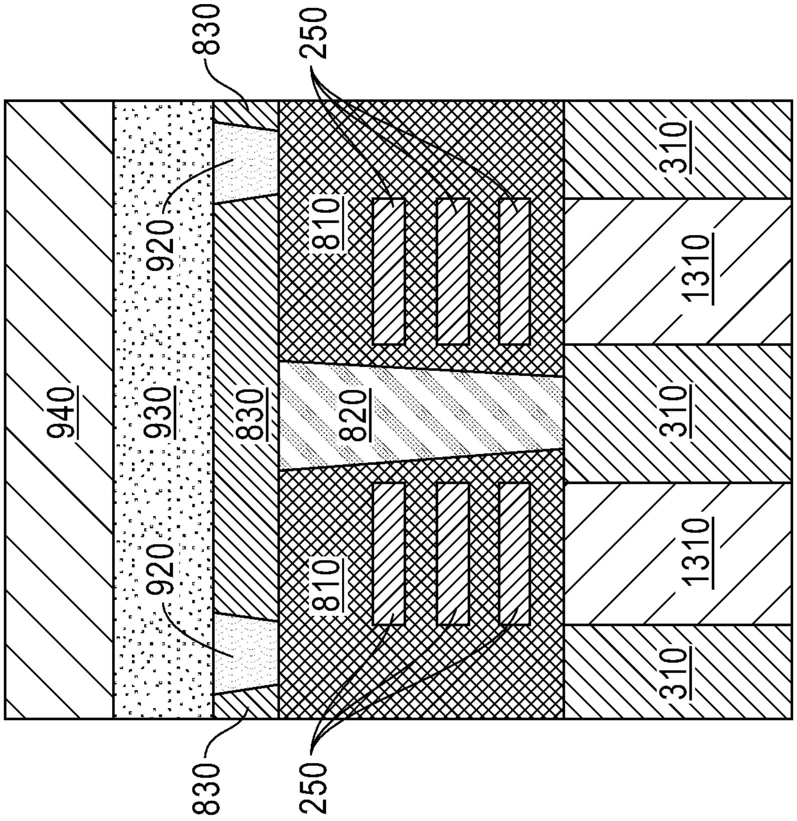
FIG. 13B depicts a cross-sectional view, along section line B of FIG. 1.
Figure 13C:
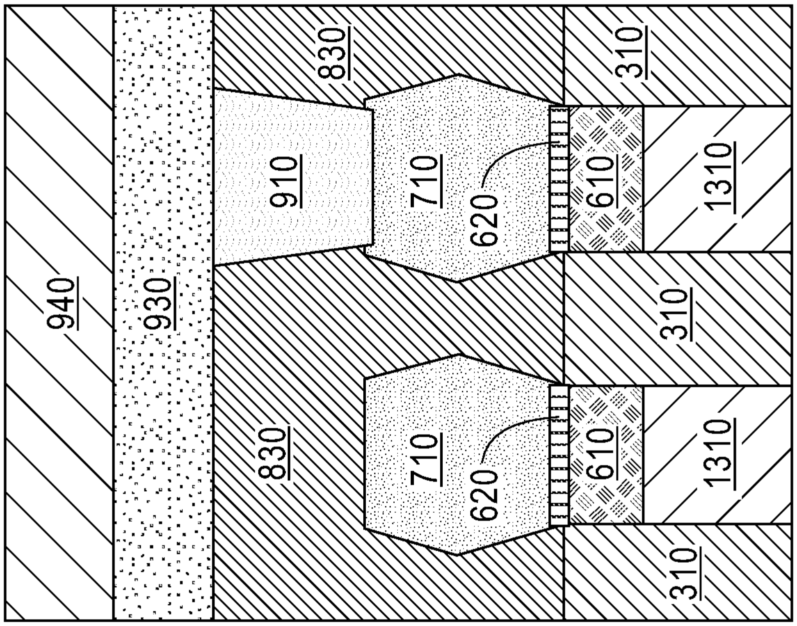
FIG. 13C depicts a cross-sectional view, along section line C of FIG. 1, of a process of forming a backside interlayer dielectric, in accordance with an embodiment of the present invention.

FIG. 13A depicts a cross-sectional view, of fabrication steps, along section line A of FIG. 1, FIG. 13B depicts a cross-sectional view along section line B of FIG. 1, and FIG. 13C depicts a cross-sectional view along section line C of FIG. 1. FIGS. 13A-13C depict the formation of backside ILD 1310.

Backside ILD 1310 material is formed on (under, as depicted) exposed surfaces of inner spacers 410, sidewall spacers 510, etch stop layer 610, and replacement gate 810 and laterally adjacent to STI layer 310.

Backside ILD 1310 may be composed of silicon dioxide, undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. The term "low-κ" as used throughout the present application denotes a dielectric material that has a dielectric constant of less than silicon dioxide. In another embodiment, a self-planarizing material such as a spin-on glass (SOG) or a spin-on low-κ dielectric material such as SiLK™ can be used as backside ILD 1310. The use of a self-planarizing dielectric material as backside ILD 1310 may avoid the need to perform a subsequent planarizing step.

In one embodiment, backside ILD 1310 can be formed utilizing a deposition process including, for example, CVD, PECVD, evaporation or spin-on coating. In some embodiments, particularly when non-self-planarizing dielectric materials are used as backside ILD 1310, a planarization process, such as CMP, or an etch back process follows the deposition of the dielectric material that provides backside ILD 1310 such that the bottom surface of backside ILD 1310 is coplanar with the bottom surface (as depicted) of STI layer 310.

Figure 14A:
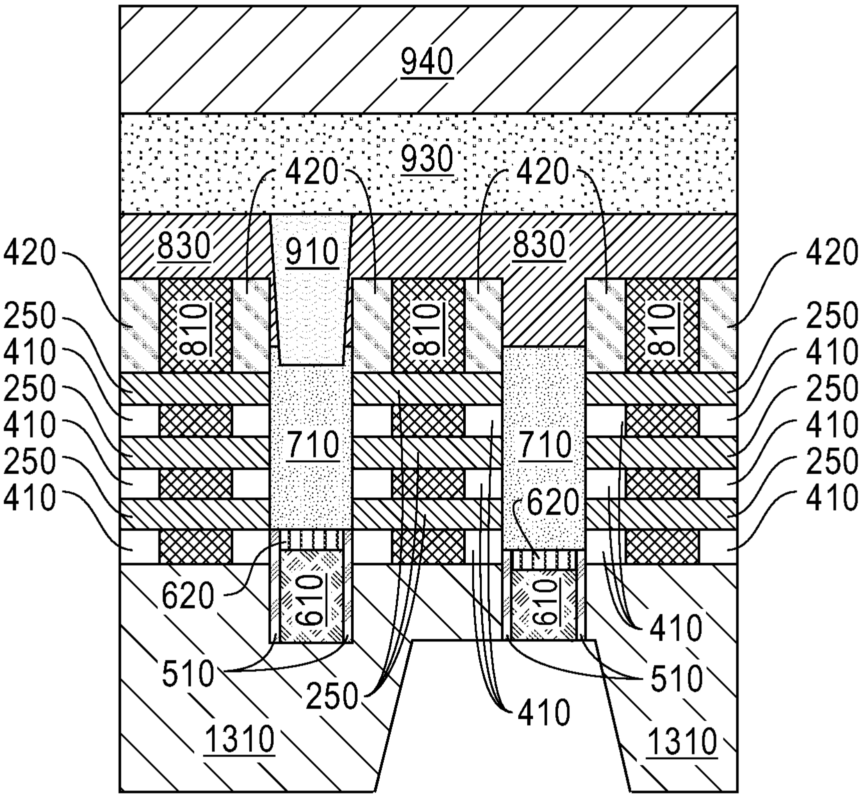
FIG. 14A depicts a cross-sectional view, along section line A of FIG. 1.
Figure 14C:
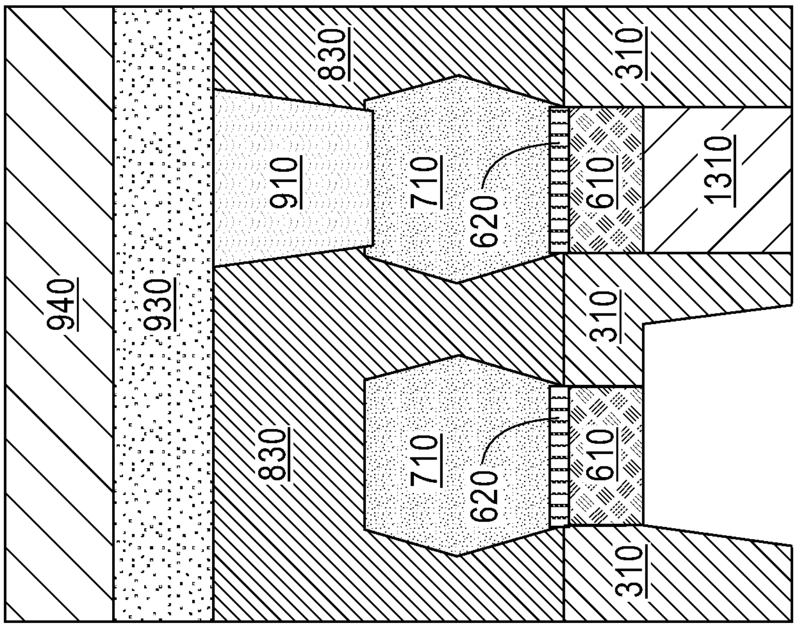
FIG. 14C depicts a cross-sectional view, along section line C of FIG. 1, of a process of forming a backside contact trench, in accordance with an embodiment of the present invention.
Figure 14B:
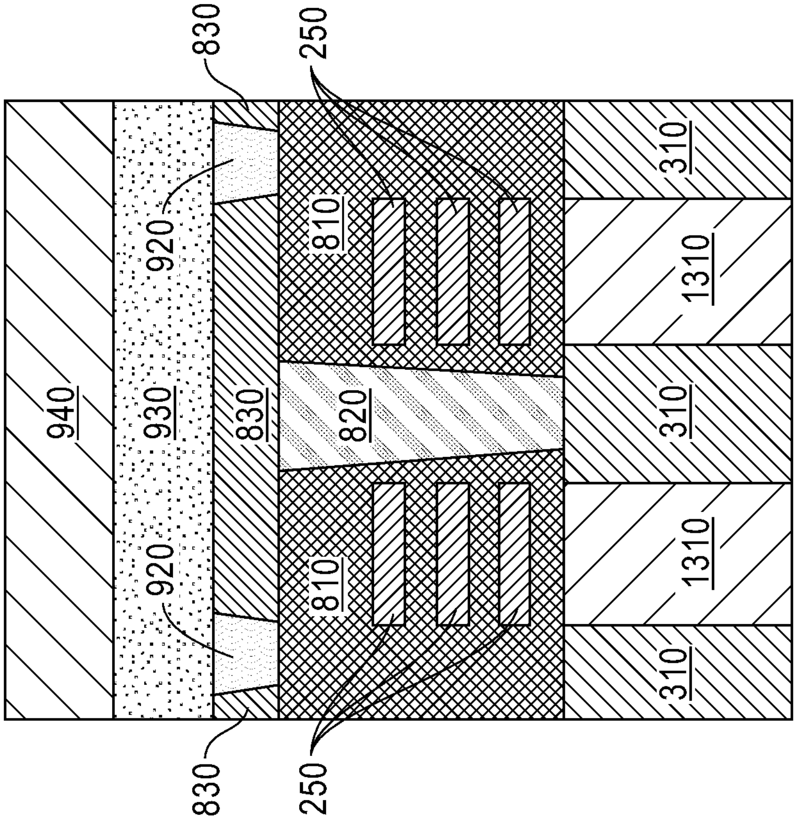
FIG. 14B depicts a cross-sectional view, along section line B of FIG. 1.

FIG. 14A depicts a cross-sectional view, of fabrication steps, along section line A of FIG. 1, FIG. 14B depicts a cross-sectional view along section line B of FIG. 1, and FIG. 14C depicts a cross-sectional view along section line C of FIG. 1. FIGS. 14A-14C depict an initial step of the backside contact trench formation.

A trench may be formed by an etching process such as RIE, laser ablation, or any etch process which can be used to selectively remove a portion of material such as backside ILD 1310, and STI layer 310. A hardmask (not shown) may be patterned using photoresist to expose areas where trenches are desired and the hardmask may be utilized during the etching process in the creation of the trenches. The etching process only removes portions of the device not protected by the hardmask and the etching process stops at etch stop layer 610.

In some embodiments, subsequent to the formation of the trenches, the hardmask is removed. In general, the process of removing the hardmask involves the use of an etching process such as RIE, laser ablation, or any etch process which can be used to selectively remove a portion of material, such as the hardmask. In some embodiments, prior to the removal of the hardmask, the photoresist (not shown) is removed. The process of removing the photoresist is similar to that of the process of removing the hardmask.

As depicted in FIGS. 14A and 14C, the trench is formed with respect to the source/drain region 710 that is not already contacted by S/D contacts 910. As depicted in FIGS. 14A and 14C, embodiments of the present invention recognize that the fabrication steps described herein and the resulting structure provide an improvement in the art in that even if alignment errors during trench formation, the likelihood of a backside contact to gate short or a backside contact to neighboring S/D short is reduced.

Figure 15A:
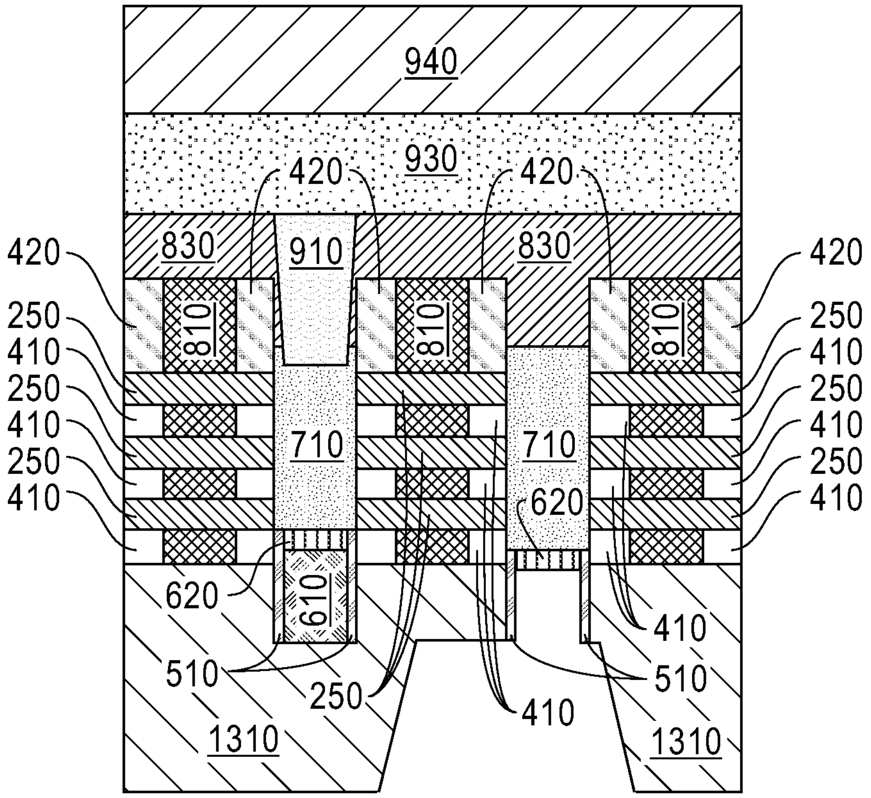
FIG. 15A depicts a cross-sectional view, along section line A of FIG. 1.
Figure 15C:
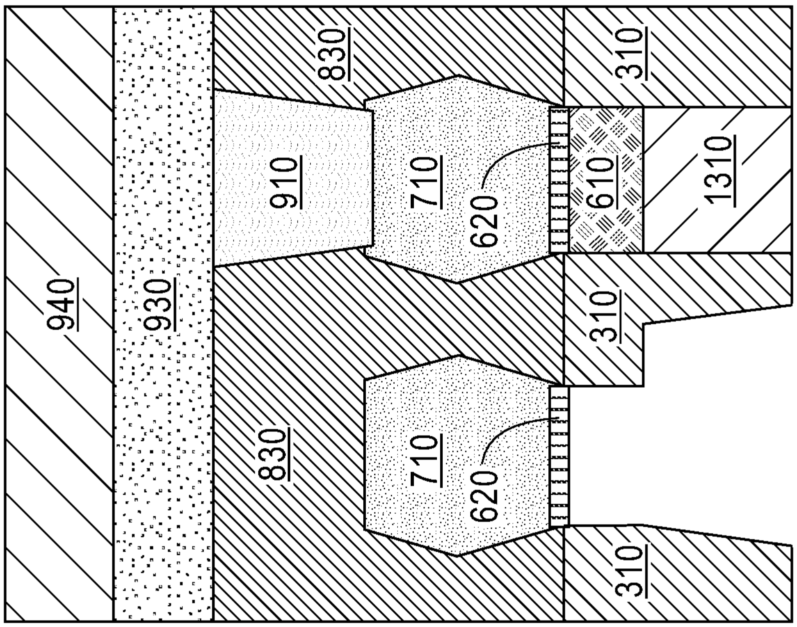
FIG. 15C depicts a cross-sectional view, along section line C of FIG. 1, of a process of removing an exposed portion of the etch stop layer, in accordance with an embodiment of the present invention.
Figure 15B:
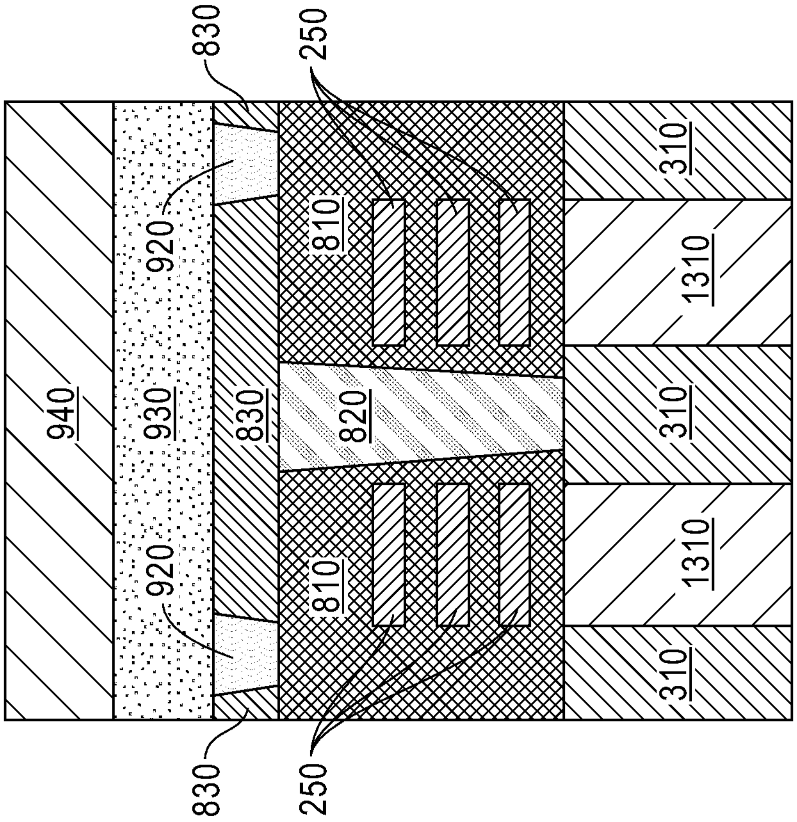
FIG. 15B depicts a cross-sectional view, along section line B of FIG. 1.

FIG. 15A depicts a cross-sectional view, of fabrication steps, along section line A of FIG. 1, FIG. 15B depicts a cross-sectional view along section line B of FIG. 1, and FIG. 15C depicts a cross-sectional view along section line C of FIG. 1. FIGS. 15A-15C depict the selective removal of the exposed portion of etch stop layer 610 that is depicted as being under the source/drain region 710 that does not yet have a source/drain contact.

The exposed etch stop layer 610 may be removed by an etching process, such as RIE, wet etch, or any etch process which can be used to selectively etch the etch stop layer 610 relative to STI layer 310, backside ILD 1310, sidewall spacers 510, and buffer layer 620.

Figure 16A:
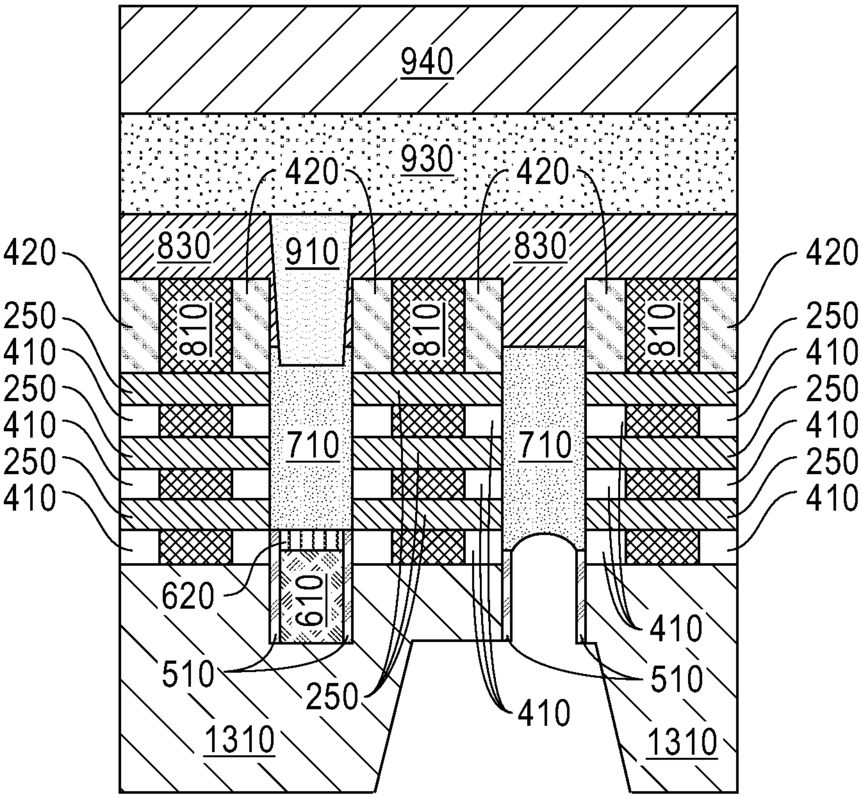
FIG. 16A depicts a cross-sectional view, along section line A of FIG. 1.
Figure 16C:
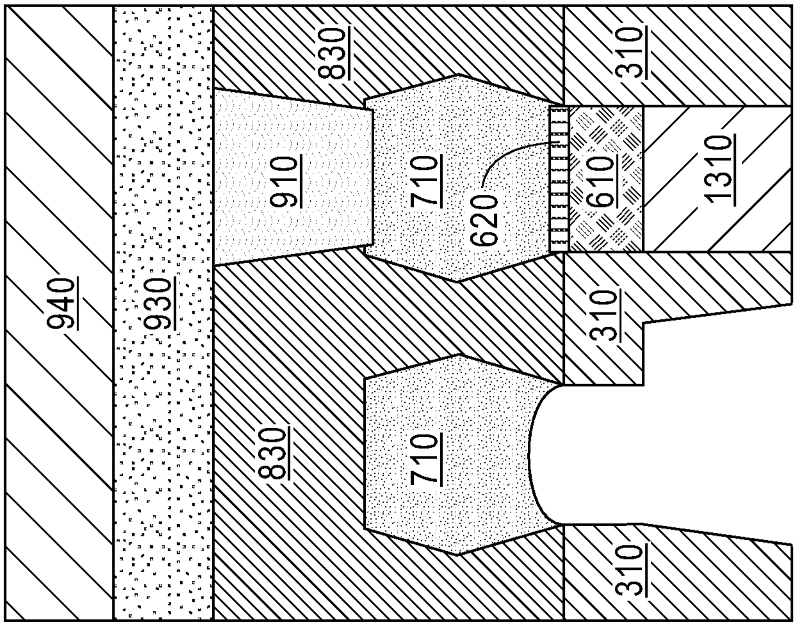
FIG. 16C depicts a cross-sectional view, along section line C of FIG. 1, of a process of recessing an exposed buffer layer, in accordance with an embodiment of the present invention.
Figure 16B:
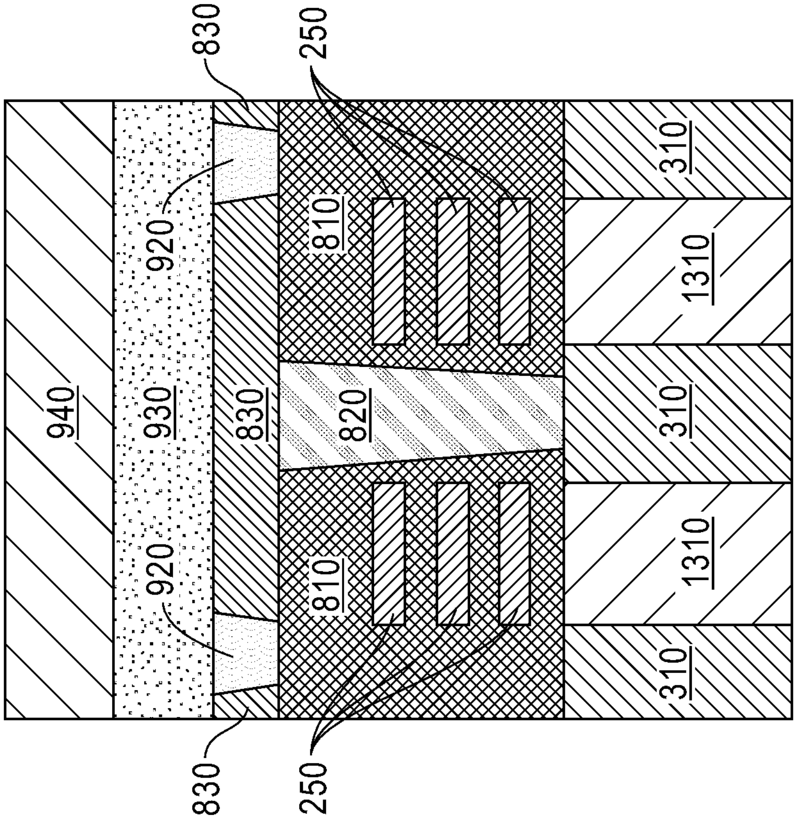
FIG. 16B depicts a cross-sectional view, along section line B of FIG. 1.

FIG. 16A depicts a cross-sectional view, of fabrication steps, along section line A of FIG. 1, FIG. 16B depicts a cross-sectional view along section line B of FIG. 1, and FIG. 16C depicts a cross-sectional view along section line C of FIG. 1. FIGS. 16A-16C depict the recessing of the exposed buffer layer 620 that is depicted as being under the source/drain region 710 that does not yet have a source/drain contact.

The exposed buffer layer 620 may be removed by an etching process, such as RIE, wet etch, or any etch process which can be used to selectively etch the buffer layer 620 relative to STI layer 310, backside ILD 1310, sidewall spacers 510, and source/drain region 710. In some embodiments, such as the embodiment depicted in FIG. 16A and FIG. 16C, some exposed portion of the exposed source/drain region 710 may also be removed during the process of recessing the exposed buffer layer 620.

Figure 17A:
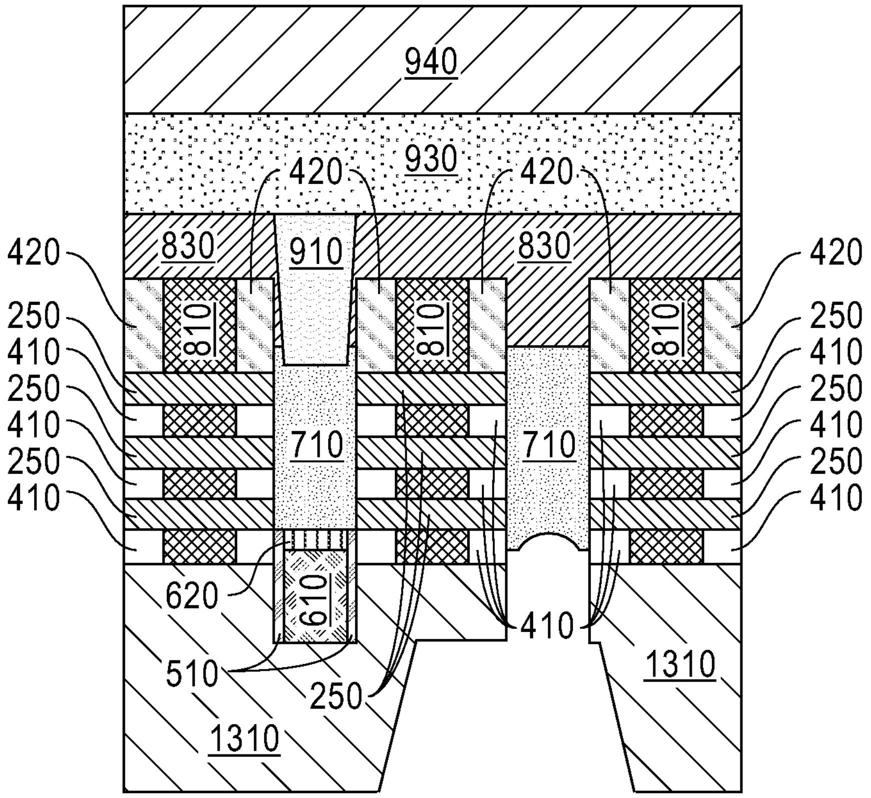
FIG. 17A depicts a cross-sectional view, along section line A of FIG. 1.
Figure 17C:
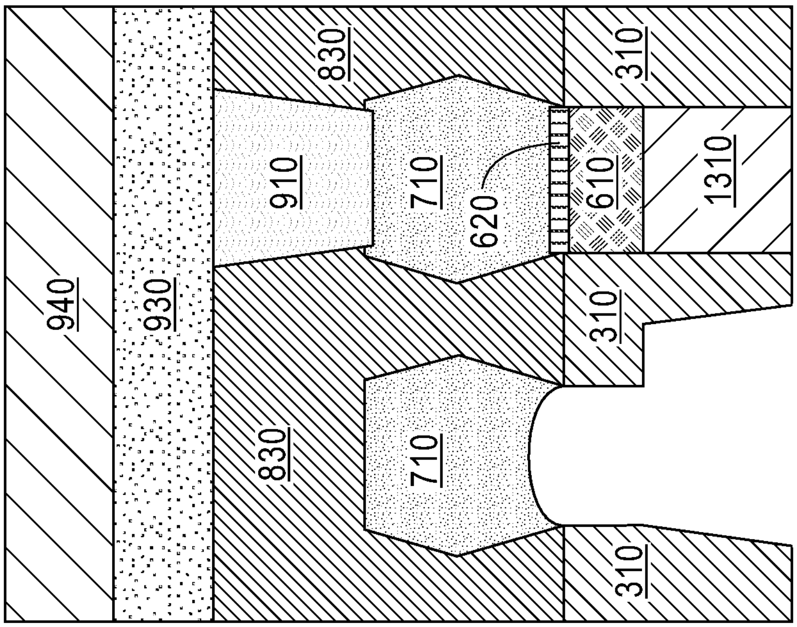
FIG. 17C depicts a cross-sectional view, along section line C of FIG. 1, of a process of removing exposed portions of the sidewall spacers, in accordance with an embodiment of the present invention.
Figure 17B:
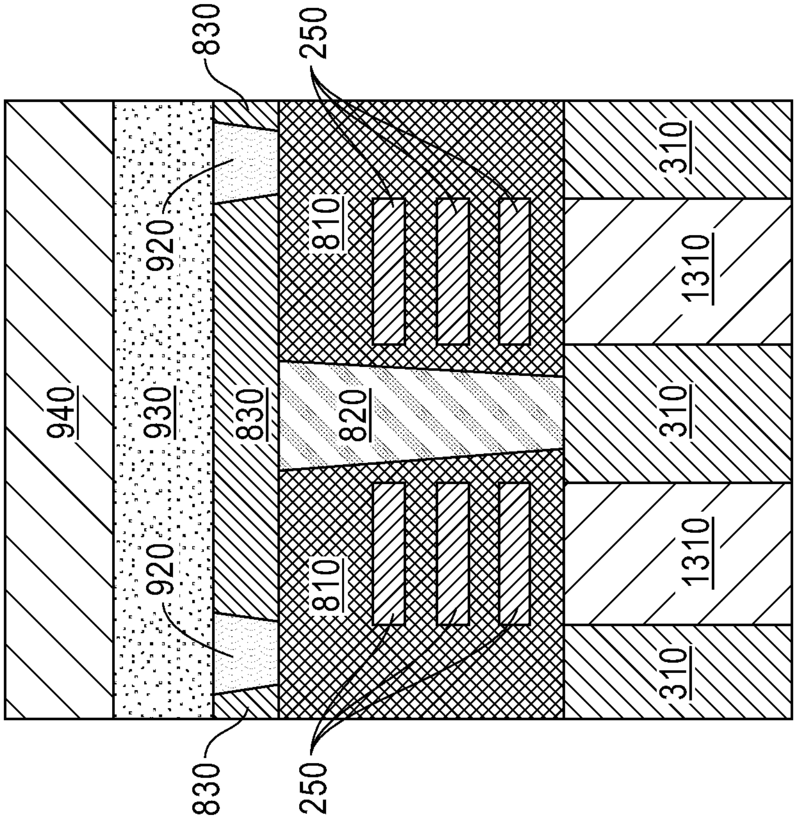
FIG. 17B depicts a cross-sectional view, along section line B of FIG. 1.

FIG. 17A depicts a cross-sectional view, of fabrication steps, along section line A of FIG. 1, FIG. 17B depicts a cross-sectional view along section line B of FIG. 1, and FIG. 17C depicts a cross-sectional view along section line C of FIG. 1. FIGS. 17A-17C depict the removal of exposed portions of sidewall spacers 510.

Exposed portions of sidewall spacers 510 may be removed by an etching process, such as RIE, wet etch, or any etch process which can be used to selectively etch sidewall spacers 510 relative to backside ILD 1310, STI layer 310, and source/drain region 710.

Figure 18A:
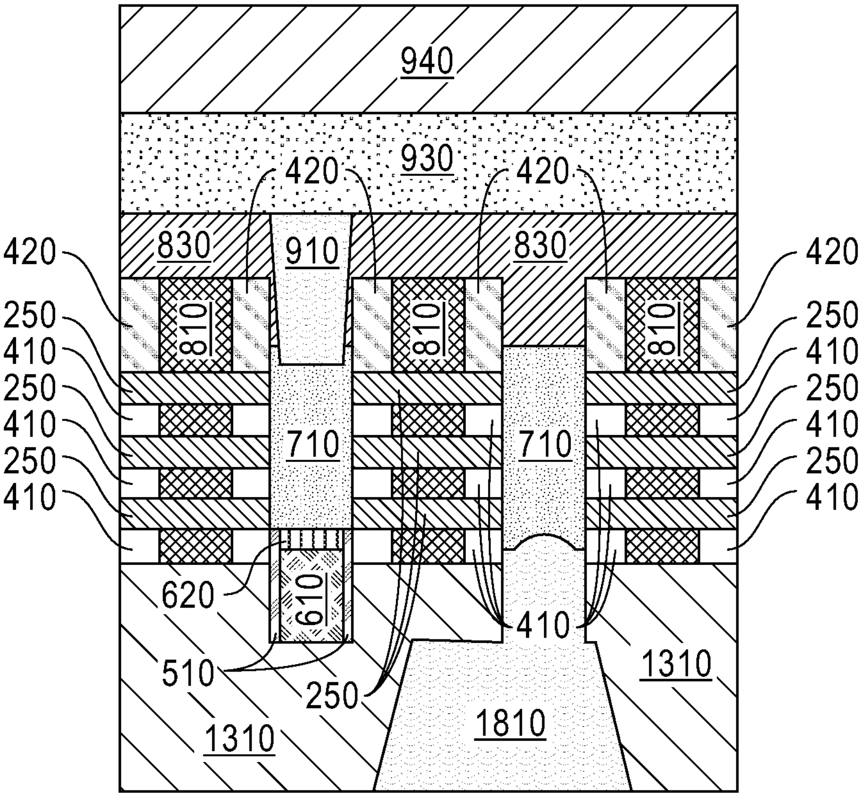
FIG. 18A depicts a cross-sectional view, along section line A of FIG. 1.
Figure 18C:
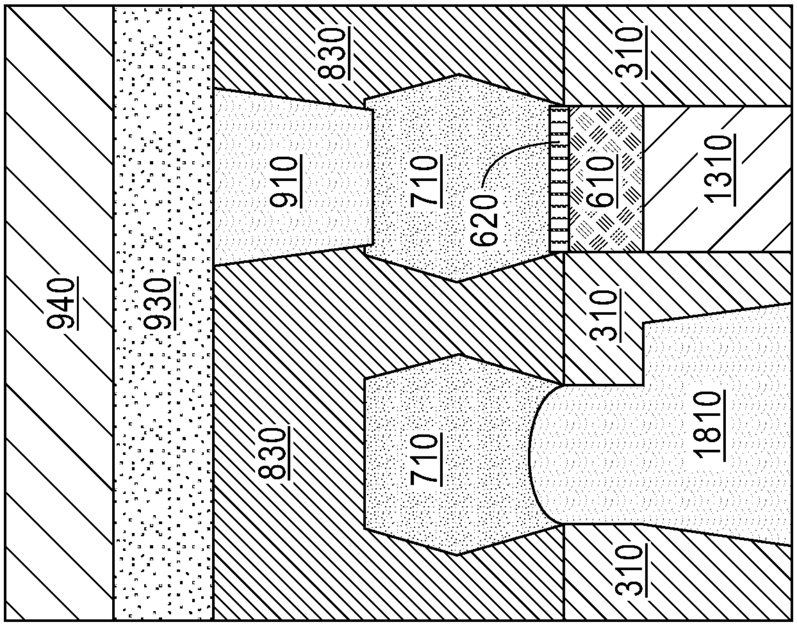
FIG. 18C depicts a cross-sectional view, along section line C of FIG. 1, of a process of forming a backside contact, in accordance with an embodiment of the present invention.
Figure 18B:
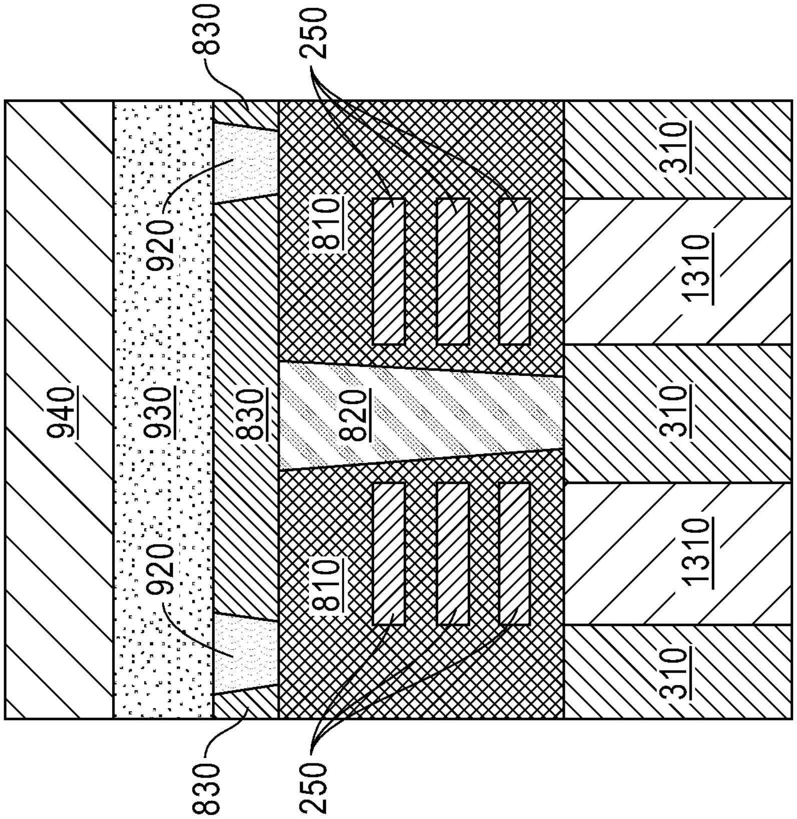
FIG. 18B depicts a cross-sectional view, along section line B of FIG. 1.

FIG. 18A depicts a cross-sectional view, of fabrication steps, along section line A of FIG. 1, FIG. 18B depicts a cross-sectional view along section line B of FIG. 1, and FIG. 18C depicts a cross-sectional view along section line C of FIG. 1. FIGS. 18A-18C depict the formation of backside contact 1810.

In general, backside contact 1810 is formed in the previously formed trench (as discussed in reference to FIGS. 14A-14C though 17A-17C. Backside contact 1810 makes contact with a source/drain 710 not already in contact with source/drain contact 910.

Backside contact 1810 may be formed by metal deposition and planarization. The metal layers comprise a silicide liner, such as, for example, Ti, Ni, or NiPt, followed by adhesion metal liner, such as, for example, TiN, and a conductive metal fill, such as, for example, Co, Ru, W, or Cu.

Backside contact 1810 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

Figure 19A:
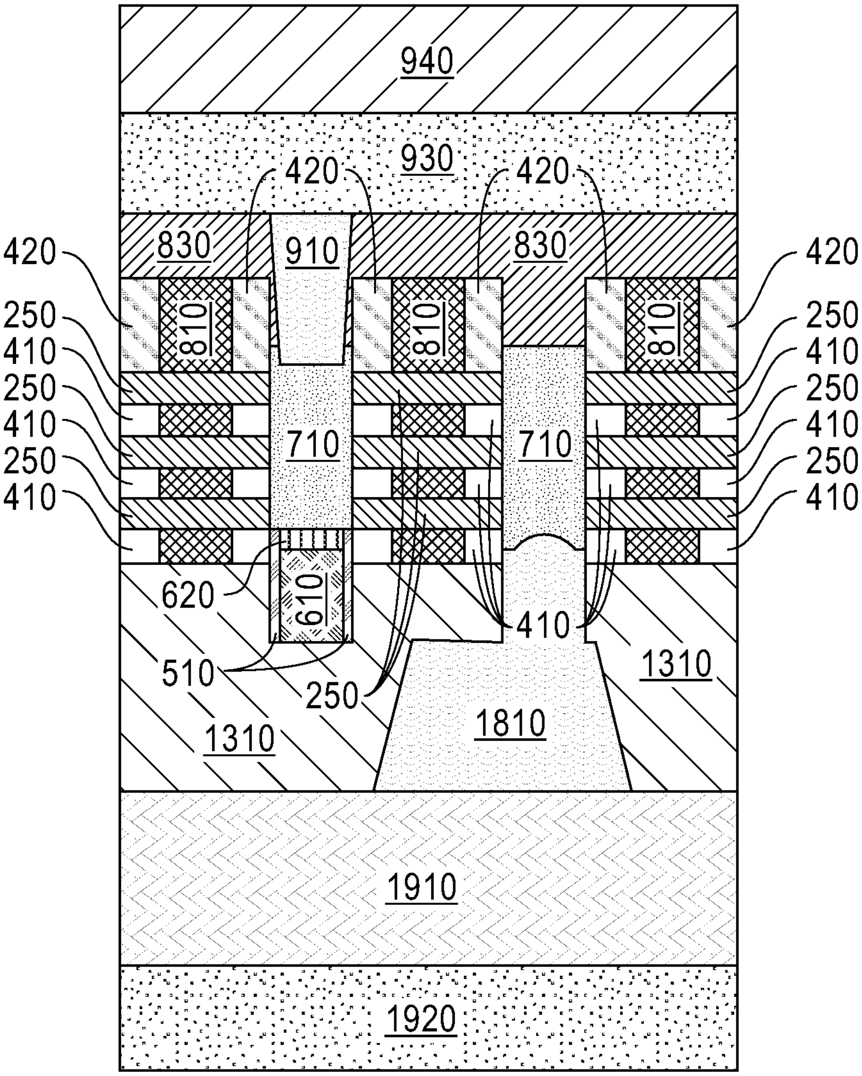
FIG. 19A depicts a cross-sectional view, along section line A of FIG. 1.
Figure 19B:
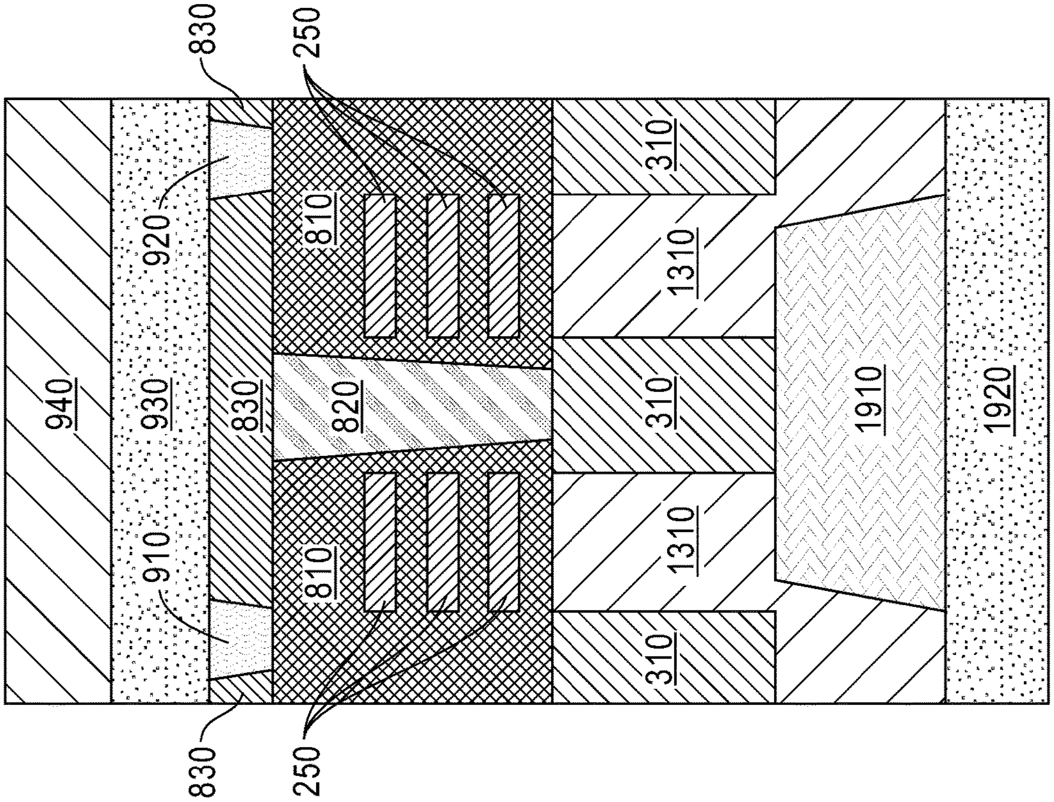
FIG. 19B depicts a cross-sectional view, along section line B of FIG. 1.
Figure 19C:
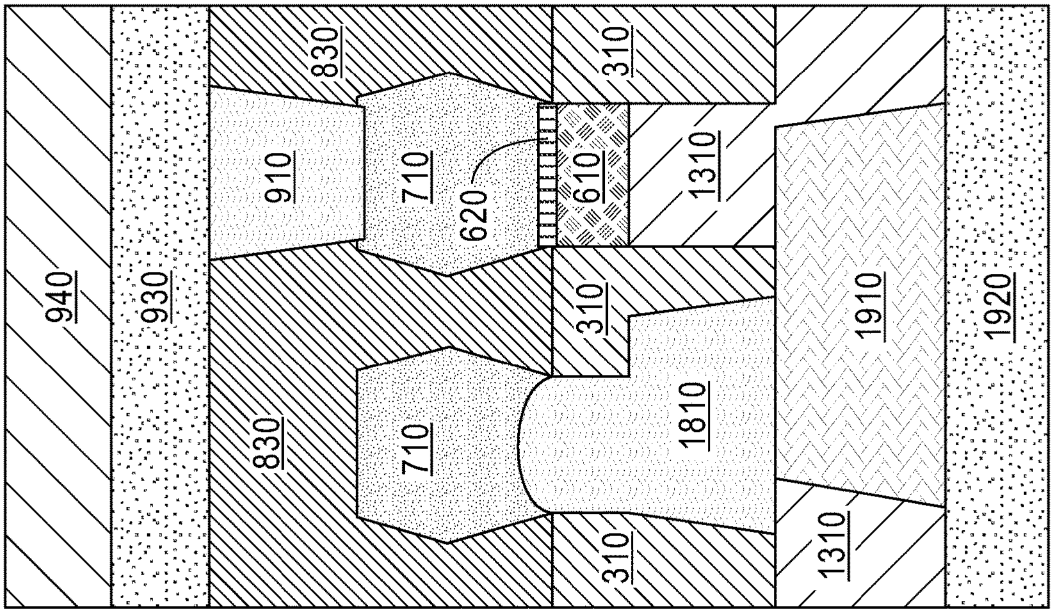
FIG. 19C depicts a cross-sectional view, along section line C of FIG. 1, of a process of forming additional backside ILD, a backside power rail, and a backside power delivery network (BSPDN), in accordance with an embodiment of the present invention.

FIG. 19A depicts a cross-sectional view, of fabrication steps, along section line A of FIG. 1, FIG. 19B depicts a cross-sectional view along section line B of FIG. 1, and FIG. 19C depicts a cross-sectional view along section line C of FIG. 1. FIGS. 19A-19C depicts the formation of additional backside ILD 1310, backside power rail 1910, and backside power delivery network (BSPDN) 1920.

Additional backside ILD 1310 material is formed beneath (as depicted) the already present backside ILD 1310 material and backside contact 1810.

Backside ILD 1310 may be composed of silicon dioxide, undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. The term "low-κ" as used throughout the present application denotes a dielectric material that has a dielectric constant of less than silicon dioxide. In another embodiment, a self-planarizing material such as a spin-on glass (SOG) or a spin-on low-κ dielectric material such as SiLK™ can be used as backside ILD 1310. The use of a self-planarizing dielectric material as backside ILD 1310 may avoid the need to perform a subsequent planarizing step.

In one embodiment, backside ILD 1310 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as backside ILD 1310, a planarization process or an etch back process follows the deposition of the dielectric material that provides backside ILD 1310.

One or more trenches may be formed by an etching process, such as reactive-ion etching (RIE), laser ablation, or any etch process which can be used to remove a portion of material such as backside ILD 1310. A hardmask (not shown) may be patterned using photoresist to expose areas of backside ILD 1310 where trench(es) are desired and the hardmask may be utilized during the etching process in the creation of the trenches. The etching process only removes portions of backside ILD 1310 not protected by the hardmask, and the etching process stops coplanar to a bottom surface (as depicted) of backside contact 1810.

In some embodiments, subsequent to the formation of the trenches, the hardmask is removed. In general, the process of removing the hardmask involves the use of an etching process such as RIE, laser ablation, or any etch process which can be used to selectively remove a portion of material, such as the hardmask. In some embodiments, prior to the removal of the hardmask, the photoresist (not shown) is removed. The process of removing the photoresist is similar to that of the process of removing the hardmask.

Backside power rail 1910 may be formed by, for example, depositing (e.g., by PVD), a metal layer (e.g., a thin adhesion TiN layer followed by bulk Cu, Co, or Ru fill) on exposed surfaces of backside contact 1810 and backside ILD 1310. Any deposition process may be used for the formation of the metal layer including, for example, chemical vapor deposition (CVD), plasma enhanced chemical vapor deposition (PECVD), physical vapor deposition (PVD), plating, sputtering, or atomic layer deposition. In other embodiments, co-evaporation techniques may be utilized to form backside power rail 1910. In yet other embodiments, known sputter deposition or chemical vapor deposition techniques may be utilized to form the silicide layer.

In some embodiments, backside power rail 1910 is deposited such that backside power rail 1910 surrounds the silicide layer and fills the remaining area of the trench. Backside power rail 1910 may be in direct contact with the silicide layer, backside contact 1810, and backside ILD 1310.

Backside power rail 1910 can include a conductive material including, for example, Cu, Co, Ru, W with a thin adhesion liner such as, for example, TiN.

Backside power rail 1910 can be formed utilizing a deposition process including, for example, plating, chemical vapor deposition (CVD), plasma enhanced chemical vapor deposition (PECVD), physical vapor deposition (PVD), sputtering, atomic layer deposition (ALD) or other like deposition processes.

In general, backside power rail 1910 makes contact with a backside contact 1810 that is contacting a source/drain region 710 that is not already contacted by source/drain contact 910.

BSPDN 1920 comprises a backside power delivery network that is depicted as a simplified layer. BSPDN 1920 may be formed according to processes known in the art.

Subsequent to the formation of BSPDN 1920, the wafer may be released from carrier wafer 940 and flipped over (original flip which was discussed in reference to FIGS. 10A-10C was never depicted) such that BSPDN 1920 is on the bottom of the wafer and operates as a backside power delivery network. Alternatively, the carrier wafer 940 is kept, and through-silicon vias (TSVs) can be formed form backside of the wafer to BEOL interconnect at frontside.

The resulting semiconductor structure includes a first source/drain region 710 wired to a backside power rail 1910 through a backside contact 1810 and a second source/drain region 710 wired to a BEOL interconnect 930 through a frontside contact (S/D contact 910). The resulting semiconductor structure may further include a placeholder structure under the second source/drain region 710 that includes a silicon buffer layer 620, a SiGe etch stop layer 610 under the silicon buffer layer 620, and a sidewall spacer layer (sidewall spacers 510) which isolates the silicon buffer layer 620 from the inner spacers 410. The resulting semiconductor structure may further include that the sidewall spacers 510 are also formed between the backside ILD 1310 and the SiGe etch stop layer 610.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:

a first source/drain region electrically connected to a backside power rail through a backside contact;

a second source/drain region electrically connected to a back end of line (BEOL) interconnect through a frontside contact; and a placeholder structure on a surface of the second source/drain region, wherein:

the placeholder structure is laterally adjacent to the backside contact; and the placeholder structure comprises an etch stop layer, a buffer layer adjacent to the second source/drain region, and a sidewall spacer, wherein: (i) the sidewall spacer is formed between a backside interlayer dielectric and the etch stop layer and (ii) the buffer layer is a different material composition than the etch stop layer.

2. The semiconductor structure of claim 1, wherein the buffer layer comprises a silicon buffer layer.

3. The semiconductor structure of claim 2, wherein:

the etch stop layer is adjacent to the silicon buffer layer; and the etch stop layer is silicon germanium.

4. The semiconductor structure of claim 2, wherein the sidewall spacer is between the silicon buffer layer and an inner spacer layer.

5. The semiconductor structure of claim 4, wherein the etch stop layer is silicon germanium.

6. The semiconductor structure of claim 1, further comprising a backside power delivery network contacting the backside power rail.

7. The semiconductor structure of claim 1, further comprising a carrier wafer contacting the BEOL interconnect.

8. The semiconductor structure of claim 1, further comprising a gate region electrically connected to the BEOL interconnect through a second frontside contact.

9. The semiconductor structure of claim 8, wherein the gate region wraps around a nanosheet stack of semiconductor channel material layers.

10. The semiconductor structure of claim 4, wherein the inner spacer layer contacts a gate region.

11. The semiconductor structure of claim 9, wherein an inner spacer layer contacts a nanosheet of the nanosheet stack of semiconductor channel material layers.

12. A semiconductor structure comprising:

a first source/drain region and a second source/drain region;

a placeholder structure on a surface of the second source/drain region on a backside of the second source/drain region opposite of a frontside of the second source/drain region, wherein:

the frontside of the second source/drain region is contacting a first contact; and the placeholder structure comprises: (i) an etch stop layer and (ii) a buffer layer adjacent to the second source/drain region, wherein the buffer layer is a different material composition than the etch stop layer; and a second contact contacting the first source/drain region, the second contact laterally adjacent to the placeholder structure, wherein a backside interlayer dielectric layer completely separates the second contact from the placeholder structure.

* * * * *